United States Patent
Mahgerefteh et al.

(10) Patent No.: US 10,243,322 B2
(45) Date of Patent: Mar. 26, 2019

(54) SURFACE COUPLED SYSTEMS

(71) Applicant: Finisar Corporation, Sunnyvale, CA (US)

(72) Inventors: Daniel Mahgerefteh, Los Angeles, CA (US); Jianxiao Chen, Fremont, CA (US); Bernd Huebner, Mountain View, CA (US); Xiaojie Xu, Pleasanton, CA (US); Yasuhiro Matsui, Milpitas, CA (US); David Adams, Stockholm (SE); The' Linh Nguyen, San Jose, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 15/384,270

(22) Filed: Dec. 19, 2016

(65) Prior Publication Data

US 2017/0179680 A1    Jun. 22, 2017

Related U.S. Application Data

(60) Provisional application No. 62/379,569, filed on Aug. 25, 2016, provisional application No. 62/268,907, filed on Dec. 17, 2015.

(51) Int. Cl.
*G02B 6/12* (2006.01)
*H01S 5/026* (2006.01)
(Continued)

(52) U.S. Cl.
CPC .............. *H01S 5/026* (2013.01); *G02B 6/122* (2013.01); *G02B 6/124* (2013.01); *G02B 6/12004* (2013.01); *G02B 6/1228* (2013.01); *H01S 5/0064* (2013.01); *H01S 5/1032* (2013.01); *H01S 5/187* (2013.01); *H01S 5/22* (2013.01); *H01S 5/3013* (2013.01); *G02B 6/2746* (2013.01); *G02B 2006/12147* (2013.01); *H01S 5/005* (2013.01); *H01S 5/02252* (2013.01);
(Continued)

(58) Field of Classification Search
None
See application file for complete search history.

(56) References Cited

U.S. PATENT DOCUMENTS 6,118,915 A      9/2000  Sato
6,282,219 B1 *   8/2001  Butler ................ G02B 6/12004
                                                    372/102

(Continued)

FOREIGN PATENT DOCUMENTS

WO    WO 2017/106880 A1 *  6/2017

OTHER PUBLICATIONS

International Search Report and Written Opinion dated Mar. 20, 2017 in related PCT Application No. PCT/US2016/067634 (16 pages).

*Primary Examiner* — Michael Stahl
(74) *Attorney, Agent, or Firm* — Maschoff Brennan

(57) ABSTRACT

A system includes a surface coupled edge emitting laser that includes a core waveguide, a fan out region optically coupled to the core waveguide in a same layer of the surface coupled edge emitting laser as the core waveguide; and a first surface grating formed in the fan out region; and a photonic integrated circuit (PIC) that includes an optical waveguide and a second surface grating formed in an upper layer of the PIC, wherein the second surface grating is in optical alignment with the first surface grating.

34 Claims, 30 Drawing Sheets

(51) Int. Cl.
*H01S 5/187* (2006.01)
*G02B 6/124* (2006.01)
*H01S 5/00* (2006.01)
*H01S 5/22* (2006.01)
*H01S 5/30* (2006.01)
*G02B 6/122* (2006.01)
*H01S 5/10* (2006.01)
*G02B 6/27* (2006.01)
*H01S 5/022* (2006.01)
*H01S 5/12* (2006.01)
*H01S 5/125* (2006.01)
*H01S 5/20* (2006.01)

(52) U.S. Cl.
CPC .............. *H01S 5/1035* (2013.01); *H01S 5/12* (2013.01); *H01S 5/125* (2013.01); *H01S 5/2027* (2013.01)

(56) References Cited

U.S. PATENT DOCUMENTS

| | | | |
|---|---|---|---|
| 8,267,583 B2* | 9/2012 | Yao | G02B 6/13 384/31 |
| 8,503,841 B2* | 8/2013 | Kopp | G02B 6/126 385/11 |
| 8,660,391 B1* | 2/2014 | Fish | B82Y 20/00 359/484.03 |
| 9,715,064 B1* | 7/2017 | Gambino | G02B 6/124 |
| 2002/0176463 A1* | 11/2002 | Bullington | G02B 6/124 372/45.01 |
| 2007/0279634 A1 | 12/2007 | Gruhlke et al. | |
| 2009/0003762 A1* | 1/2009 | Chiniwalla | G02B 6/1228 385/14 |
| 2010/0006784 A1 | 1/2010 | Mack et al. | |
| 2012/0328234 A1* | 12/2012 | Lu | G02B 6/1228 385/14 |
| 2013/0259077 A1* | 10/2013 | Ben Bakir | G02B 6/12004 372/44.01 |
| 2015/0177459 A1 | 6/2015 | Van Campenhout et al. | |
| 2015/0260913 A1 | 9/2015 | Li et al. | |
| 2015/0260994 A1 | 9/2015 | Akutsu et al. | |
| 2015/0286008 A1* | 10/2015 | Shimizu | G02B 6/34 385/37 |
| 2016/0238793 A1* | 8/2016 | Frankel | G02B 6/305 |
| 2016/0246009 A1* | 8/2016 | Jiang | G02B 6/124 |
| 2016/0356956 A1 | 12/2016 | Davoine et al. | |
| 2017/0207600 A1* | 7/2017 | Klamkin | H01S 5/0224 |

\* cited by examiner

SURFACE COUPLED SYSTEMS

CROSS-REFERENCE TO RELATED APPLICATION

This patent application claims benefit of and priority to U.S. Provisional App. No. 62/268,907 filed Dec. 17, 2015 and to U.S. Provisional App. No. 62/379,569 filed Aug. 25, 2016 which are incorporated herein by reference.

FIELD

The embodiments discussed herein are related to surface coupled systems.

BACKGROUND

Unless otherwise indicated herein, the materials described herein are not prior art to the claims in the present application and are not admitted to be prior art by inclusion in this section.

Coupling light from single mode edge emitting lasers to silicon (Si) photonics is costly, as it generally requires two lenses and a large isolator block. In systems that include such lasers and Silicon (Si) photonics, alignment tolerances may be less than 0.5 micrometers ($\mu$m). Such low alignment tolerances typically require active alignment to be met.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate surface coupled systems.

A system may include a surface coupled edge emitting laser that includes a core waveguide, a fan out region optically coupled to the core waveguide in a same layer of the surface coupled edge emitting laser as the core waveguide; and a first surface grating formed in the fan out region; and a photonic integrated circuit (PIC) that includes an optical waveguide and a second surface grating formed in an upper layer of the PIC, where the second surface grating is in optical alignment with the first surface grating.

Another system may include a surface coupled edge emitting laser that includes a first waveguide and a first diffraction grating optically coupled to the first waveguide; and a PIC that includes a second waveguide and a second diffraction grating optically coupled to the second waveguide, where the first waveguide of the surface coupled edge emitting laser includes a core with a core index of refraction, a top cladding with a top cladding index of refraction, and a substrate as a bottom cladding with a bottom cladding index of refraction; where the first diffraction grating includes grating teeth formed on the core of the first waveguide, the grating teeth each having a total height, a height above the core of the first waveguide, a period, and a duty cycle; and where the core index of refraction is greater than a first threshold value so that an effective index of the first diffraction grating is sufficiently higher than the bottom cladding index to avoid leakage of a diffracted optical mode into the substrate.

Yet another system may include a surface coupled edge emitting laser that includes a first waveguide and a first diffraction grating optically coupled to the first waveguide; and a PIC that includes a second waveguide and a second diffraction grating optically coupled to the second waveguide, where the first waveguide of the surface coupled edge emitting laser includes a core with a core index of refraction, a top cladding with a top cladding index of refraction, and a substrate as a bottom cladding with a bottom cladding index of refraction; where the first diffraction grating includes alternating grating teeth and top cladding teeth formed above the core of the first waveguide; and where an effective index of the first diffraction grating depends on at least the core index of refraction and the top cladding index of refraction and is at least 6% higher than the bottom cladding index of refraction.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1:
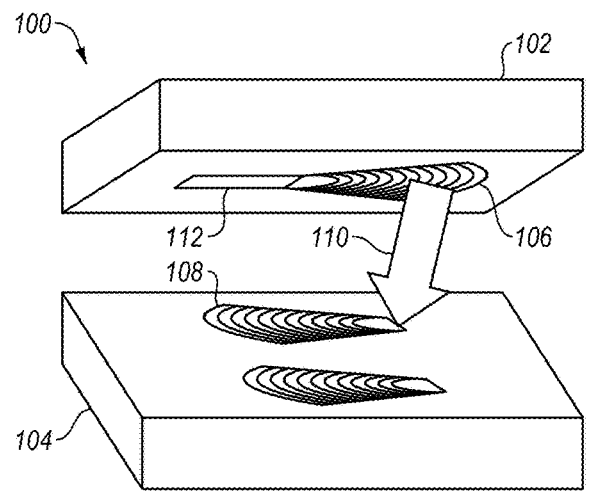
FIG. 1 illustrates an example surface coupled system.

Some embodiments described herein remove the need for lenses in systems such as those described above as generally requiring two lenses and a large isolator block, which may reduce part count and cost in such systems, and significantly simplify packaging processes in such systems. An isolator may be used in such systems. The absence of lenses in such systems may significantly reduce the size and cost of the isolator and may significantly increase alignment tolerances. For example, the alignment tolerance may be increased by a factor of 10 or even 50 or more from about 0.1 µm which has to be done by active feed-back alignment, which requires turning on the laser during alignment, to about 1-2 µm or even 5-8 µm or more achieved in a passive alignment pick-and place machine; i.e. without having to turn on the laser. Alternatively or additionally, embodiments described herein may enable wafer level testing of lasers.

According to some embodiments, a surface coupled system including a first surface grating (or first diffraction grating or transmit grating) and a second surface grating (or second diffraction grating or receive grating) is provided to couple light from an edge emitting laser to a PIC, such as a Si PIC. In some embodiments, the first and second surface gratings may each include a small index contrast long surface grating. In general, a small index contrast long surface grating may include a surface grating with an index contrast less than about 1-1.5 and a length greater than 10 µm. In other embodiments, the first and second surface gratings may each include a large area surface grating (LASG) with a length greater than about 10 µm and with or without small index contrast.

The edge emitting laser may include an indium phosphide (InP) laser or other suitable edge emitting laser. The InP laser may include an input passive waveguide that expands in a fan out region to the first surface grating. The first surface grating may be configured to generate a relatively large optical mode spot size of about 8-40 µm for an optical beam diffracted by the first surface grating.

The second surface grating may be formed in the Si PIC. The second surface grating may be configured to receive the optical beam diffracted by the first surface grating and to redirect the optical beam into a waveguide of the Si PIC.

Embodiments described herein additionally include aspects of the first diffraction grating. In an example embodiment, a surface coupled system may include a surface coupled edge emitting laser and a PIC. The surface coupled edge emitting laser may include a first waveguide and a first diffraction grating optically coupled to the first waveguide. The PIC may include a second waveguide and a second diffraction grating optically coupled to the second waveguide. The first waveguide of the surface coupled edge emitting laser may include a core with a core index of refraction, a top cladding with a top cladding index of refraction, and a substrate as a bottom cladding with a bottom cladding index of refraction. The first diffraction grating may include grating teeth formed on the core of the first waveguide, the grating teeth may each have a total height, a height above the core of the first waveguide, a period, and a duty cycle. The core index of refraction may be greater than a first threshold value so that an effective index of the first diffraction grating is sufficiently higher than the bottom cladding index to avoid leakage of a diffracted optical mode into the substrate.

The core index of refraction which in some embodiments may be the same as a grating tooth index of refraction of the grating teeth may be greater than or equal to 3.4, such as in a range from 3.4 to 3.44, or equal to 3.42. Various other parameters of the first diffraction grating according to one or more example embodiments are described below.

In another example embodiment, a surface coupled system may include a surface coupled edge emitting laser and a PIC. The surface coupled edge emitting laser may include a first waveguide and a first diffraction grating optically coupled to the first waveguide. The PIC may include a second waveguide and a second diffraction grating optically coupled to the second waveguide. The first waveguide of the surface coupled edge emitting laser may include a core with a core index of refraction, a top cladding with a top cladding index of refraction, and a substrate as a bottom cladding with a bottom cladding index of refraction. The first diffraction grating may include alternating grating teeth and top cladding teeth formed above the core of the first waveguide. An effective index of the first diffraction grating may depend on at least the core index of refraction and the top cladding index of refraction and may be at least 6% higher than the bottom cladding index of refraction.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

FIG. 1 illustrates an example surface coupled system 100, arranged in accordance with at least one embodiment described herein. The surface coupled system 100 may include a surface coupled edge emitting laser (hereinafter "laser") 102 and a Si PIC 104. In at least one embodiment, the laser 102 may include an InP laser.

Additionally, the laser 102 may include a first surface grating 106 and the Si PIC 104 may include a second surface grating 108. The first surface grating 106 may be optically coupled to an active section 112 of the laser 102 through a core waveguide. The core waveguide may be optically coupled to receive light emitted by a gain medium (not illustrated) of the active section 112 of the laser 102. In some embodiments, a fan out region may be provided between the core waveguide and the first surface grating 106 and/or may include the core waveguide. The fan out region may be formed from a same medium and layer as the core waveguide such that the fan out region may generally be an extension of the core waveguide. Additionally, the fan out region may include grating lines such that the fan out region may generally be an extension of the first surface grating 106.

The light emitted from the active section 112 of the laser 102 may travel through the core waveguide to the fan out region, where a mode of the light may be expanded laterally (e.g., generally in and out of the page in FIG. 1). The first surface grating 106 may diffract the light with the laterally expanded mode generally downward as diffracted light 110. The diffracted light 110 may be diffracted toward the second surface grating 108 of the Si PIC 104. The mode of the diffracted light 110 may be expanded to a 8-40 µm spot size (lateral measurement) within the fan out region while simultaneously being expanded along the direction of the active section 112 by the first surface grating 106. One potential benefit of this method of expanding diffracted light may be that the spot size may be much larger than the 2 to 4 µm spot size that can be achieved with standard spot size converters.

The diffracted light 110 may be received by the second surface grating 108. The diffracted light 110 may be redirected by the second surface grating 108 into a waveguide (not illustrated) of the Si PIC 104. One example of the waveguide may be a Si waveguide. Although not illustrated, an optical isolator may be provided between the first surface grating 106 and the second surface grating 108 to reduce back reflection. The optical isolator may be attached to the Si PIC 104 and/or the laser 102.

In other laser-PIC systems, one potential issue may be that two lenses and a large optical isolator block may be used to couple light from a laser to a Si waveguide of a PIC due to the relatively small spot size in such systems. These other laser-PIC systems and other similar systems may have an alignment tolerance of the laser relative to the PIC of 0.1 µm. Another potential issue of these other laser-PIC systems and other similar systems is that alignment is generally actively performed (e.g., performed with the laser on).

In comparison, the alignment tolerance between the laser 102 and Si PIC 104, in accordance with systems and designs discussed herein, may be 1-2 µm or more. Such an alignment tolerance may allow alignment to be performed passively (e.g., laser off during alignment).

Surface gratings, such as the first surface grating 106 and the second surface grating 108 discussed herein, may include a periodic structure. The period structure may have an index of refraction that periodically alternates by providing repeated periodic regions of alternating materials. The periodic regions may be called corrugations or teeth. The corrugations or teeth of the first surface grating 106 and the second surface grating 108 may be partially etched to improve directionality of the diffracted light 110.

The periodic regions of alternating materials may have a region with a first material with a first index of refraction and another region with a second material with a second index of refraction. A difference between the first index of refraction and the second index of refraction may be referred to as index contrast of the surface grating. A length of the periodic structure in a direction of light propagation may be referred to as a length of the surface grating. A depth of the surface grating or of a corrugation included in the periodic structure, where depth is measured in a direction that is both orthogonal to the light propagation direction and orthogonal to the lateral expansion direction, may be referred to as Kappa, or K.

Gratings formed in InP are typically used as distributed feedback reflectors (DBR) to form a mirror in a laser cavity. In these applications the grating reflects the light, which is incident from a waveguide in InP, directly back 180 degrees relative to the input and in the same plane as the input, e.g., back reflection. The index contrast of the grating is between indium gallium arsenic phosphide (InGaAsP) and InP which have slightly different refractive indices depending on exact composition of InGaAsP. As an example of a DBR, the InP grating may have an index contrast of about 0.01 with a Kappa of 100-200 cm-1 and a length of about 100 µm. An example InP grating with these configurations may achieve about 92% coupling efficiency. The bandwidth of an InP surface grating may be about 4 nanometers (nm) if the InP surface grating is centered on a nominal center wavelength of the laser. According to at least one embodiment described herein, however, InP gratings may be designed to diffract the incoming light out of the plane of incidence and so is a diffraction grating that may be referred to as a surface grating.

In at least one embodiment, an InP surface grating may have an index contrast of about 2 using deep etched InGaAsP or InP surface gratings with a silicon dioxide (SiO2) or other dielectric top cladding and the InP surface grating may also have a length of about 50 μm to achieve a low coupling loss of −0.5 dB. Coupling loss may be a ratio of power directed out of a plane of the grating into a narrow angle in a far field relative to a total power at an input of a waveguide.

The length of an example InP surface grating may be longer than the length of an example Si/SiO$_2$ surface grating because the effective index contrast of an example InP surface grating, defined as the overlap integral of the optical mode with the grating index profile, may be relatively smaller than the effective index contrast of an example Si surface grating. An example InP surface grating may be designed with a high coupling efficiency using a bandwidth as high as 80 nm in some embodiments.

An example of the second surface grating 108 may include a Si surface grating. An example Si surface grating may have an index contrast of about 2 and a length of 10-20 μm. An example Si surface grating with these configurations may be designed for far field emission into about a 10 μm fiber mode over about a 30 nm bandwidth. An example Si surface grating may be designed to match a mode profile generated by an example InP surface grating. Alternatively, the Si PIC 104, as discussed herein, may include a silicon nitride (SiN) surface grating implemented as the second surface grating 108. A SiN surface grating may have a smaller index contrast than a Si surface grating. As such, a mode profile for a SiN surface grating may better match a mode profile of an example InP surface grating.

A coupling efficiency of an example Si surface grating with an index contrast of roughly 2 and a length between 10-20 μm may be between 0.8 to 2 decibels (dB). An example Si surface grating with a smaller index contrast and/or a longer length may have a better coupling efficiency than 0.8 to 2 dB. In some embodiments, the length of an example Si surface grating may be extended to match or substantially match the length of an example InP surface grating.

For surface gratings, such as the first surface grating 106 and second surface grating 108, as discussed above and herein, maximal coupling, or resonance, may occur at a resonance wavelength as defined in equation 1:

$$\frac{2\pi}{\lambda_0} n_s \sin\theta + \frac{2\pi}{\Lambda} = \frac{2\pi}{\lambda_0} n_w, \qquad \text{Equation 1}$$

In equation 1, $\lambda_0$ may indicate the resonance wavelength, $n_s$ may indicate an index of refraction of a cladding of a surface grating, θ may be a coupling angle, Λ may be a grating period of a surface grating, and $n_w$ may be an effective index of a surface grating. The effective index $n_w$ of the surface grating may depend on, e.g., a depth of an etch, a refractive index of a core, and a refractive index of a dielectric, where the core and dielectric make up the periodic regions of the periodic structure of the surface grating. For a fixed grating period and coupling angle, the coupling efficiency may degrade as a wavelength moves away from a resonance wavelength because a resonance condition of Equation 1 is no longer satisfied.

Equation 2 introduces a wave vector mismatch quantity, as a function of wavelength:

$$\Delta\beta(\lambda) = \frac{2\pi}{\lambda} n_w - \left(\frac{2\pi}{\lambda} n_s \sin\theta + \frac{2\pi}{\Lambda}\right), \qquad \text{Equation 2}$$

In equation 2, Δβ is the wave vector mismatch as a function of wavelength λ and $n_s$, $n_w$, and Λ are as described with respect to Equation 2. At resonance, Δβ(λ) may equal to 0.

Figure 2A:
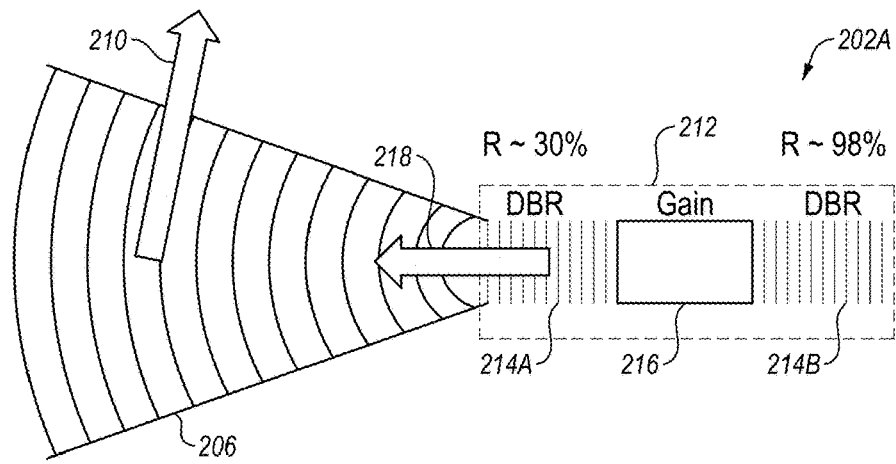
FIGS. 2A and 2B illustrate an example surface coupled edge emitting laser that may be implemented in a surface coupled system.
Figure 2B:
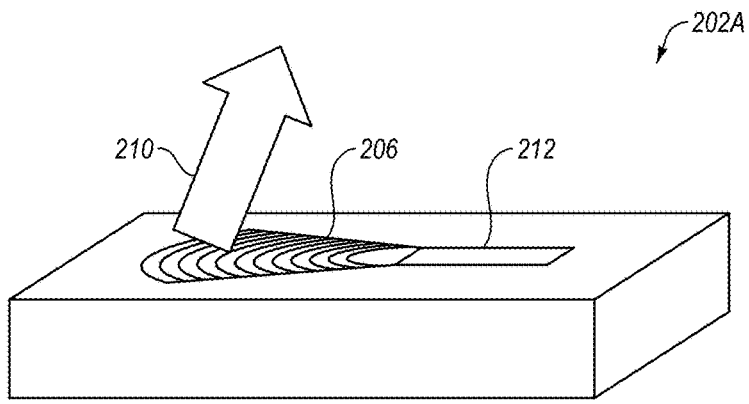
Figure 2C:
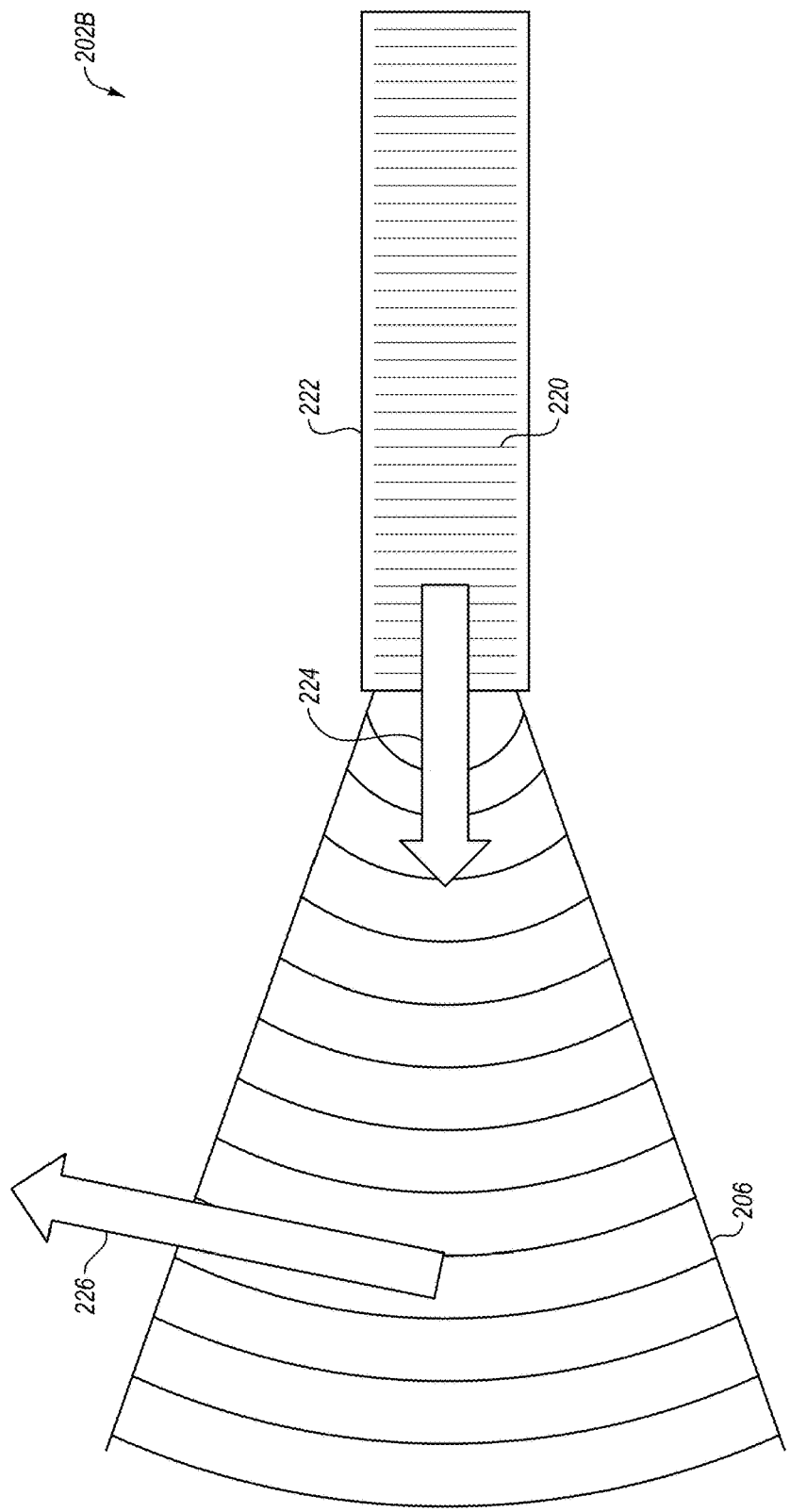
FIG. 2C illustrates another example surface coupled edge emitting laser that may be implemented in a surface coupled system.

FIGS. 2A and 2B illustrate an example surface coupled edge emitting laser (hereinafter "laser") 202A that may be implemented in a surface coupled system, such as the surface coupled system 100 discussed in relation to FIG. 1. FIG. 2A includes a bottom view and FIG. 2B includes a bottom perspective view of the laser 202A. FIG. 2C illustrates another example surface coupled edge emitting laser (hereinafter "laser") 202B that may be implemented in a surface coupled system, such as the surface coupled system 100 discussed in relation to FIG. 1. Each of the lasers 202A and 202B may include or correspond to the laser 102 of FIG. 1.

Referring first to FIGS. 2A and 2B, the laser 202A may include a gain medium 216, a first distributed Bragg reflector (DBR) 214A, and a second DBR 214B. The first and second DBRs 214A-B together with the gain medium 216 may form a laser cavity 212 such that the laser 202A in the example of FIGS. 2A and 2B may include a DBR laser. Alternatively or additionally, and as illustrated in FIG. 2C, the laser 202B may include a distributed feedback (DFB) laser in which a grating 220 and gain medium 222 overlap in the laser cavity. In other embodiments, a DFB type gain region and one or more passive DBR regions may both be present to provide feedback in a configuration which may be termed a Distributed Reflector (DR) laser, and which may be used for high speed laser applications. Each of the lasers 202A, 202B may include a first surface grating 206 optically coupled to the corresponding laser cavity (e.g., 212 in FIGS. 2A and 2B). The first surface grating may be similar or identical to the first surface grating 106 discussed in relation to FIG. 1. A fan out region of the first surface grating 206 may include grating lines such that the first surface grating 206 and the fan out region partially or completely overlap.

In FIGS. 2A and 2B, a reflectance of the second DBR 214B may be about 98 percent and a reflectance of the first DBR 214A may be about 30 percent. In other embodiments, the first and second DBRs 214A-B may have other reflectance values.

The laser 202A may generally emit light 218 through the first DBR 214A toward the first surface grating 206. The emitted light 218 may interact with the first surface grating 206 to be diffracted by the first surface grating 206 as diffracted light 210.

In FIG. 2C, the laser 202B implemented as a DFB laser may generally emit light 224 through a front of the DFB laser toward the first surface grating 206. The light 224 may interact with the first surface grating 206 to be diffracted by the first surface grating 206 as diffracted light 226.

The laser 202A and/or 202B may be hermetically sealed by a passivation layer formed by SiN or silicon oxide (SiO$_x$) deposition on the laser 202A or 202B. In more detail, one or more layers of SiN and/or SiO$_x$ may be deposited over the laser 202A or 202B to hermetically seal the laser 202A or 202B.

Figure 3A:
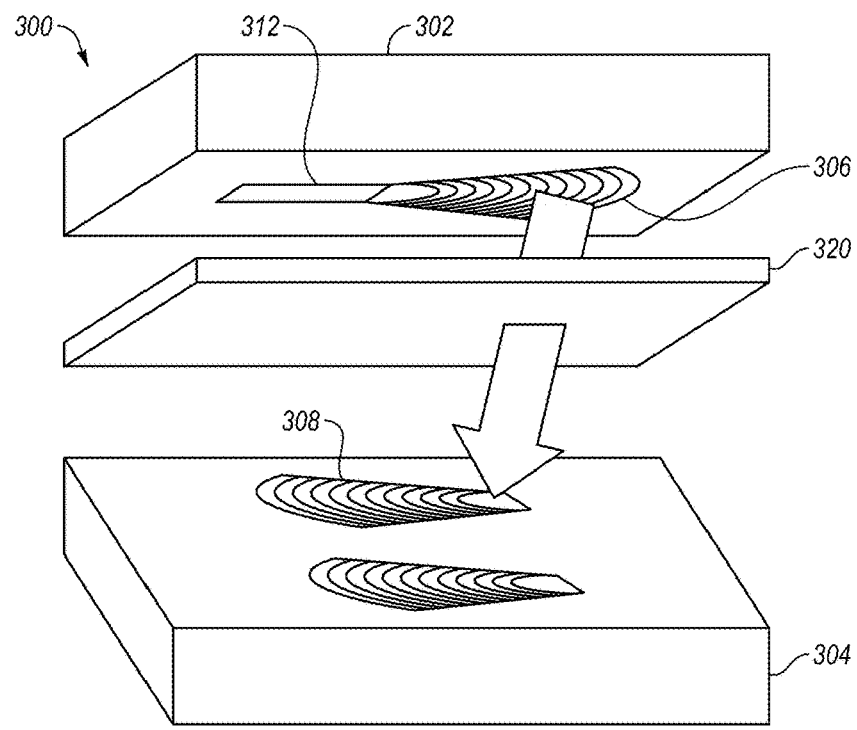
FIGS. 3A and 3B illustrate another example surface coupled system.
Figure 3B:
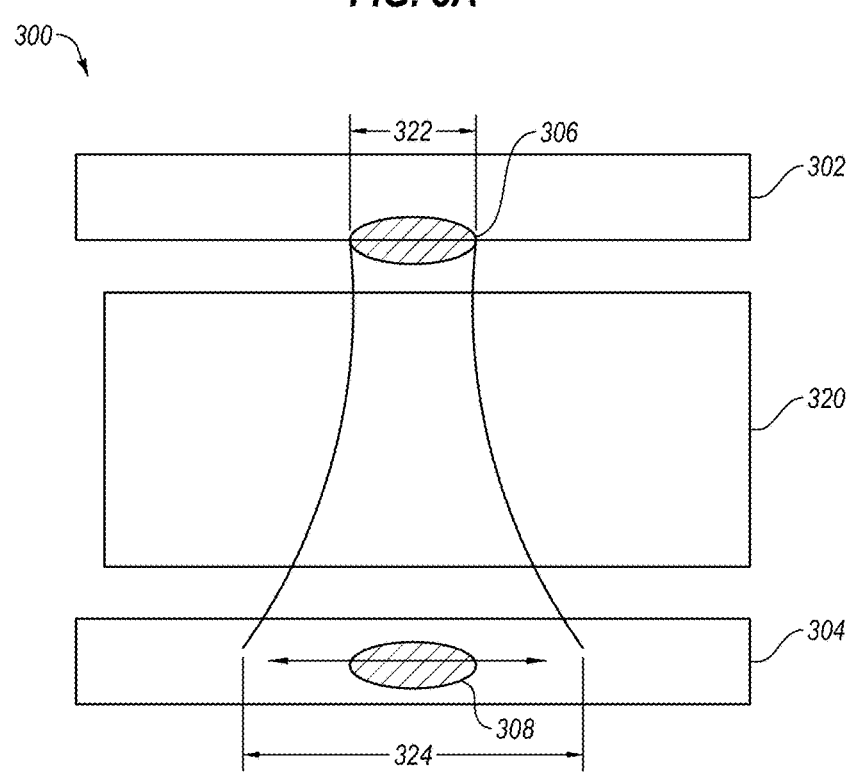

FIGS. 3A and 3B illustrate another example surface coupled system 300, arranged in accordance with at least one embodiment described herein. The surface coupled system 300 may include a surface coupled edge emitting laser (hereinafter "laser") 302 and a Si PIC 304. The laser 302 may be the same or similar to the laser 102, 202A, and/or 202B discussed above in relation to FIGS. 1 and 2A-2C. The Si PIC 304 may be the same or similar to the Si PIC 104 discussed above in relation to FIG. 1.

The laser 302 may include a first surface grating 306. The first surface grating 306 may be the same or similar to the first surface gratings 106 and 206 discussed above in relation to FIGS. 1 and 2A-2C. The Si PIC 304 may include a second surface grating 308. The second surface grating 308 may be the same or similar to the second surface grating 108 discussed above in relation to FIG. 1. The first surface grating 306 and the second surface grating 308 may alternatively or additionally each include a LASG. Alternatively or additionally, the first surface grating 306 may be referred to as a transmitter grating or a large area surface laser coupler, while the second surface grating 308 may be referred to as a receiver grating or a large area surface Si coupler. The surface coupled system 300 may also include an optical isolator 320 disposed between the laser 302 and the Si PIC 304.

The laser 302 may be configured to expand an optical mode of light emitted from a laser cavity 312 of the laser 302. The optical mode of light emitted from the laser cavity 312 may be expanded to a 8-40 µm spot size, or to a 20-40 µm spot size, or other relatively large spot size. As such, an alignment tolerance of the laser 302 relative to the Si PIC 304 may be around +/−5 µm, which may be similar to alignment tolerance of other lasers, such as a multimode (MM) vertical cavity surface emitting laser (VCSEL). For such a relatively large spot size, diffraction may be negligible for the optical isolator 320. As such, in some embodiments, the optical isolator 320 may be around 600 µm thick including a garnet with an input polarizer on an upper surface of the optical isolator 320. More generally, the optical isolator 320 may have a physical thickness in a range from 300 µm to 800 µm. The upper surface of the optical isolator 320 may be a surface that is coupled to the laser 302.

The optical isolator 320 may include an output polarizer on a lower surface of the optical isolator 320. The lower surface of the optical isolator 320 may be a surface that is coupled to the Si PIC 304. Each of the input and output polarizers may include polarizers marketed by CORNING under the trade name POLARCOR, or other suitable polarizers. The upper surface area or lower surface area of the optical isolator 320 may be 100-200 µm² or less, compared to a surface area of at least 400-500 µm² for optical isolators in other laser-PIC systems where the optical isolator is positioned between two lenses. A smaller surface area of the optical isolator 320 may reduce the cost of the optical isolator 320 in some embodiments compared to other laser-PIC systems.

A benefit of LASGs described herein can be seen by considering divergence of an optical beam from a laser, as illustrated in FIG. 3B. With reference to FIG. 3B, a spot size diffracting out of the laser 302 may be determined in accordance with equation 3:

$$w(z) = w_0 \sqrt{1 + \left(\frac{z}{z_R}\right)^2}, \text{ where}$$

Equation 3

$$z_R = \frac{\pi n w_0^2}{\lambda}$$

In equation 3, $w_0$ is an optical spot size 322, or beam waist, diffracting out of the laser 302 by the first surface grating 306, w(z) is a spot size 324 as a function of distance z, e.g., at the second surface grating 308, n is an index of refraction of a medium through which the optical beam propagates, and $z_R$ is defined on the right in Equation 3.

Assuming the first surface grating 306 of the laser 302 has a size that is same as the second surface grating 308 in the Si PIC 304 and that a beam output by the laser 302 diverges through the optical isolator 320, the spot size of the beam will grow from w0 322 to w(z) 324. The overlap between w(z) 324 and the second surface grating 308 can be used to determine a coupling loss, assuming a coupling angle is optimal.

An effective distance of the beam through each component (i.e., the optical isolator 320) between the first surface grating 306 and the second surface grating 308 is equal to a physical distance divided by a refractive index of the component or other medium through which the beam propagates. For example, a polarizer of the optical isolator 320 that is 40 µm thick with n being equal to 1.5 may have an effective distance of 40 µm/1.5, or about 27 µm.

Figure 4:
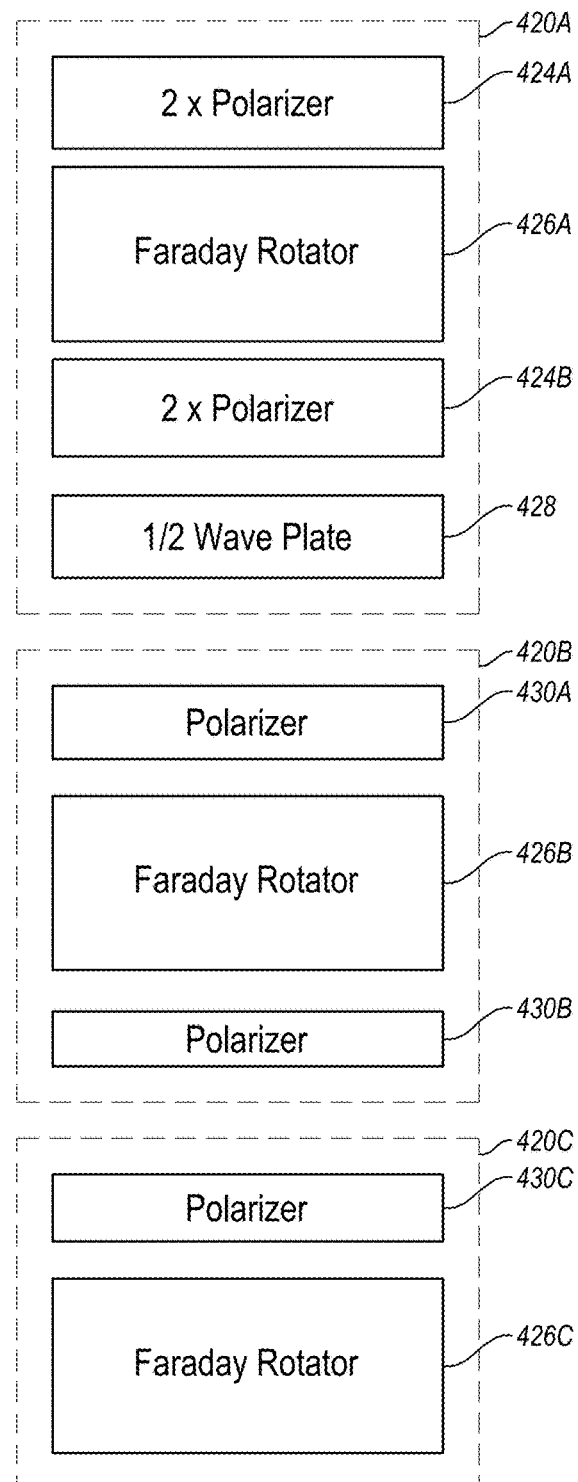
FIG. 4 illustrates three different example optical isolator configurations.

"Working distance" may be a distance in air for which a coupling loss between the spot emanating from the laser 302 (or more particularly, from the first surface grating 306 of the laser 302) diverges to a size on the second surface grating 308 that leads to a 0.5 dB loss. In some embodiments, thickness of an InP substrate of the laser 302 normalized to its refractive index of ~3.2 may be included in the 'working distance' calculation since the light from the first surface grating 306 exits through the InP substrate of the laser 302 before it impinges on the isolator stack. Given the effective distance of the optical isolator 320 and the InP substrate of the laser 302 that is between the first surface grating 306 and the second surface grating 308, the spot size, $w_0$ 322, the first surface grating 306, and the second surface grating 308 may be designed to ensure a coupling loss of <0.5 dB. According to at least one embodiment described herein, the working distance between the first surface grating of a surface coupled edge emitting laser and the second surface grating of a PIC may be at least 100 µm FIG. 4 illustrates three different optical isolator configurations 420A-C, arranged in accordance with at least one embodiment described herein. The optical isolator configurations 420A-C include a double stage isolator 420A, a single stage isolator 420B and an isolator with an integrated second polarizer 420C.

The double stage isolator 420A may include a first stack of 2×'bulk' optical polarizer 424A. As used herein, "bulk" means a micro-optic component not integrated with a Si PIC. The double stage isolator 420A may also include a Faraday rotator 426A and a second stack of 2×bulk optical polarizer 424B. The second stack of 2×bulk optical polarizer 424B may be designed for roughly 40-50 dB isolation. Additionally, the double stage isolator 420A may include a half waveplate 428 to alter or change a polarization state of a light beam.

The double stage isolator 420A may have an effective thickness of roughly 600 µm (e.g., 600-800 µm). The double stage isolator 420A may be the thickest version of the three optical isolators 420A-C discussed herein.

The single stage isolator 420B may include a first bulk polarizer 430A, a Faraday rotator 426B, and a second bulk polarizer 430B. The second bulk polarizer 430B may be designed for 20 dB isolation. The single stage isolator 420B may be designed to omit a half waveplate. For example, if a second surface grating is designed to receive a polarization state of the second bulk polarizer 430B of the single stage isolator 420B the half waveplate may be omitted. An effective thickness of the single stage isolator 420B may be roughly 300 μm.

The isolator with integrated second polarizer 420C may be designed to omit a second bulk polarizer, leaving the first bulk polarizer 430C and a Faraday rotator 426C as discrete components of the isolator with integrated second polarizer 420C. In the isolator with integrated second polarizer 420C, a second surface grating on a Si PIC may be designed for one polarization. The second surface grating may serve as a polarizer when a second bulk polarizer is omitted. A second integrated polarizer that includes a Si PIC polarization splitter (not illustrated) may be used as a second polarizer with a 10-20 dB extinction ratio. The second integrated polarizer may be located between a fiber-coupled end of a Si PIC and a waveguide connected to the second surface grating that couples to a first surface grating of a laser.

The polarizers 424A, 430A, and 430C, used to polarize to or from the laser may typically have a 40-50 dB polarization extinction ratio (PER), defined as ratio of power in a desired polarization divided by power in a rejected polarization of light through the polarizer. Such a 40-50 dB PER polarizer is typically 200 μm thick since it may include two polarizers with 20-25 dB PER stacked together with a substrate in between. It may be desirable to reduce the thickness of such a polarizer to reduce the effective working distance. In these and other embodiments, the first surface grating of a surface coupled system, which first surface grating may include a InP surface grating, may be designed to efficiently diffract light at Transverse Electric (TE) polarization at a desired angle. In this case light of orthogonal polarization, Transverse Magnetic (TM) is not efficiently coupled and the first surface grating can function as a polarizer with extinction ratio of 10-20 dB. In such an embodiment, the polarizers 424A, 430A, and 430C may be chosen to be thinner (e.g., thinner than 200 μm) and have smaller polarization extinction ratio of 20-25 dB, which together with the PER of the first surface grating may provide a similar aggregate 40-50 dB PER for a shorter working distance and lower cost. In some applications when 20 dB PER is sufficient the polarizer 424A, 430A, and 430C may be eliminated and the first surface grating may function as a 20 dB PER in the isolator stack, providing 20 dB isolation for the laser.

An example Si PIC polarization splitter is described in U.S. application Ser. No. 14/938,815 (hereinafter the '815 application), filed on Nov. 11, 2015, which is incorporated herein by reference. An advantage of replacing the second bulk polarizer with a polarizer integrated in the second surface grating may be a relative decrease in effective thickness between a first surface grating and a second surface grating, which may allow use of a relatively smaller spot size emanating from the first surface grating of a laser towards the second surface grating of the Si PIC.

Figure 5:
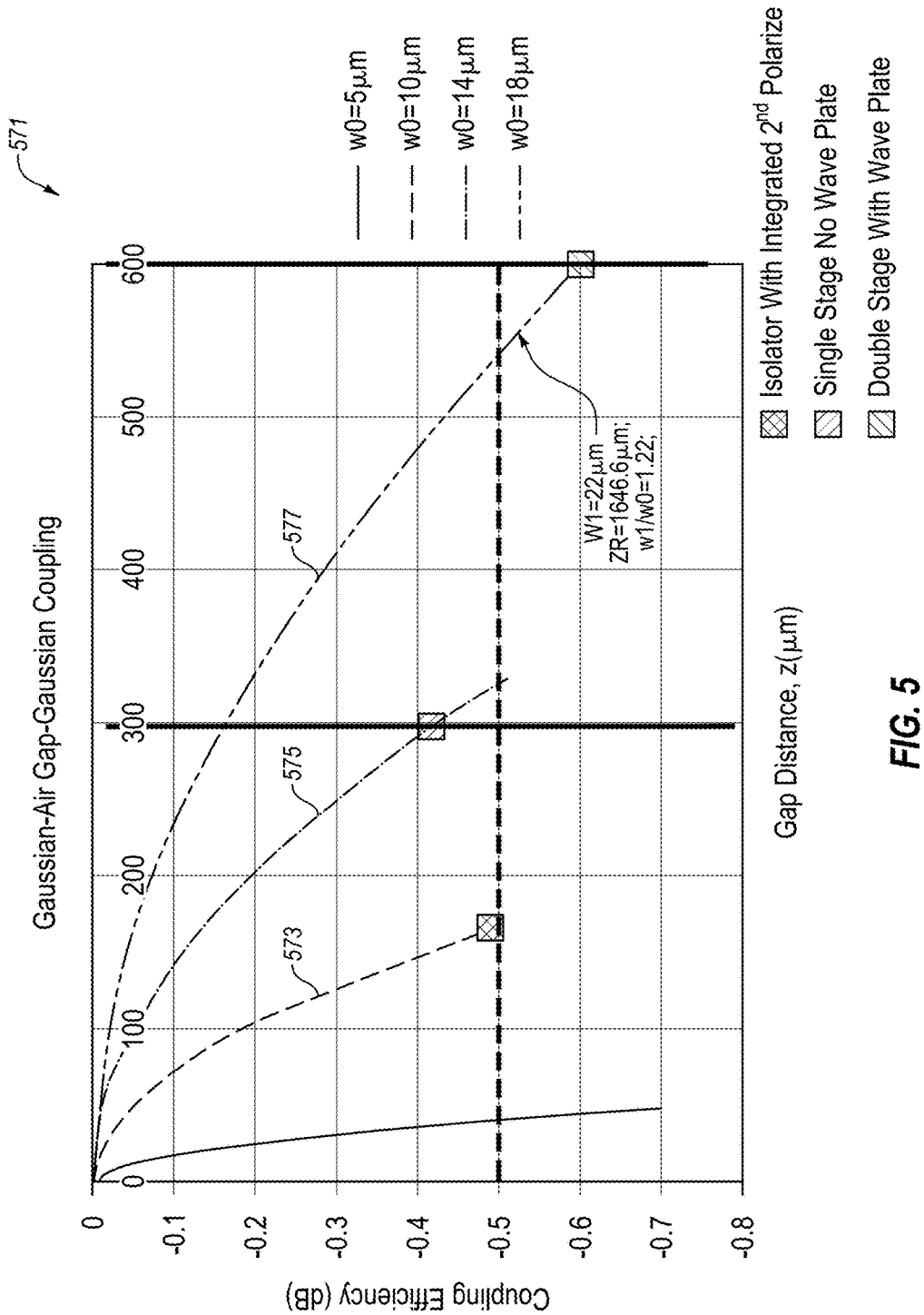
FIG. 5 illustrates a graphical representation of a simulation of coupling efficiency as a function of a gap distance z for multiple spot sizes.

FIG. 5 illustrates a graphical representation 571 of a simulation of coupling efficiency (in dB) as a function of a gap distance z (in μm) for multiple spot sizes, arranged in accordance with at least one embodiment described herein. Curves 573, 575, and 577 respectively represent coupling efficiency for spot sizes of 10 μm, 14 μm, and 18 μm. The simulation of FIG. 5 considers only the coupling efficiency due to diffraction of the spot as it couples to a second surface grating, e.g., a receiver grating, in a Si PIC. There may be additional coupling loss due to finite efficiency of coupling from the receiver grating in the Si PIC to a Si or SiN waveguide in the Si PIC.

For the curve 573, corresponding to the spot size of 10 μm, a coupling efficiency of about −0.5 dB may be achieved at a gap distance (or effective thickness) of about 160 μm. This gap distance may correspond to an effective thickness of an isolator with integrated second polarizer, such as the isolator with integrated second polarizer 420C discussed in relation to FIG. 4. For the curve 575 corresponding to the spot size of 14 μm, a coupling efficiency of about −0.4 dB may be achieved at a gap distance (or effective thickness) of about 300 μm. This gap distance may correspond to an effective thickness of a single stage isolator, such as the single stage isolator 420B discussed in relation to FIG. 4. For curve 577 corresponding to the spot size of 18 μm, a coupling efficiency of about −0.6 dB may be achieved at a gap distance (or effective thickness) of about 600 μm. This gap distance may correspond to an effective thickness of a double stage isolator, such as the double stage isolator 420A discussed in relation to FIG. 4.

Figure 6:
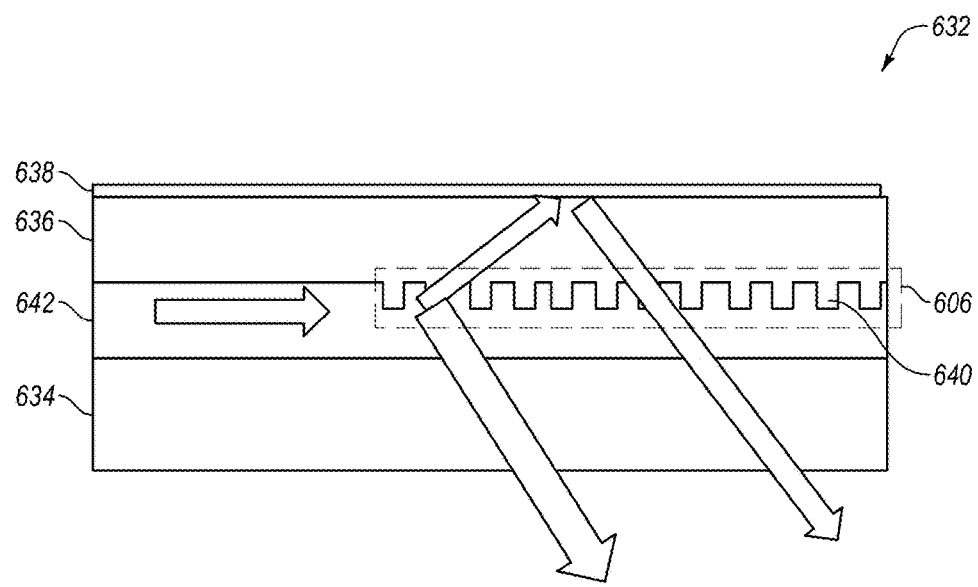
FIG. 6 illustrates a passive section of an example surface coupled edge emitting laser.

FIG. 6 illustrates a passive section 632 of an example surface coupled edge emitting laser (hereinafter "laser"), arranged in accordance with at least one embodiment described herein. The laser that includes the passive section 632 of FIG. 6 may be implemented in one or more of the surface coupled systems discussed herein. The passive section 632 may include a core waveguide 642 optically coupled to a first surface grating 606, which may correspond to or include the first surface gratings discussed elsewhere herein. The passive section 632 may also include a substrate 634 beneath the core waveguide 642 and the first surface grating 606, a dielectric 636 above the core waveguide 642 and the first surface grating 606, and a top mirror 638 above the dielectric 636. The substrate 634 may serve as cladding to the core waveguide 642. In at least one embodiment, the core waveguide 642 may include an InGaAsP waveguide. Some embodiments of a laser may include a top mirror such as the top mirror 638 while other embodiments may omit the top mirror.

The first surface grating 606 may include a periodic structure 640 formed at an interface between the core waveguide 642 and the dielectric 636. The periodic structure 640 may include a corrugated region that includes regions of core waveguide 642 that alternates with regions of dielectric 636. The regions of core waveguide 642 may have an index of refraction that is different than an index of refraction for the regions of dielectric 636. The periodic regions may be called corrugations or teeth. The periodic structure 640 may expand laterally (e.g., in and out of the page) in the light propagation direction (e.g., from left to right), e.g., in the form of a fan out region.

The dielectric 636 may include SiO2, or SiNx or other suitable dielectric passivation materials. The top mirror 638 may include gold, a dielectric stack (e.g., HR coating), or other suitable material and/or mirror. The substrate 634 may include InP or other suitable cladding material.

Although not illustrated in FIG. 6, a laser that includes the passive section 632 may additionally include an active section that includes a gain medium and one or more DBR mirrors or DFB reflectors that collectively form a laser cavity optically coupled to a core waveguide.

The passive section 632 may be configured to maximize a fraction of light diffracted by the first surface grating 606 downward through the substrate 634. Additionally, the passive section 632 may be configured to maximize a fraction of diffracted light by the first surface grating 606 through the substrate of the laser and out to a second surface grating of a Si PIC positioned beneath the laser. A fraction of a light beam travelling through the first surface grating 606 may diffract away from the substrate 634 towards the epitaxially grown top surface of the passive section 632, thereby decreasing a coupling efficiency in a direction towards the substrate 634 and into a Si PIC. As such, the top mirror 638 may be deposited on the dielectric 636 to redirect upward diffracted light beams downward through the cladding 634 and into a Si PIC. To ensure the redirected light adds in phase with the light diffracted towards the cladding 634 from the first surface grating 606, a thickness of the dielectric 636 may satisfy equation 4:

$$d = m(\lambda \cos(\theta))/2n_{dielectric},\quad\text{Equation 4}$$

In equation 4, m is an integer, n is an index of refraction of the dielectric 636, θ is an angle between normal and the propagation direction of the upward diffracted light, and λ is the wavelength of the light beam.

Figure 8A:
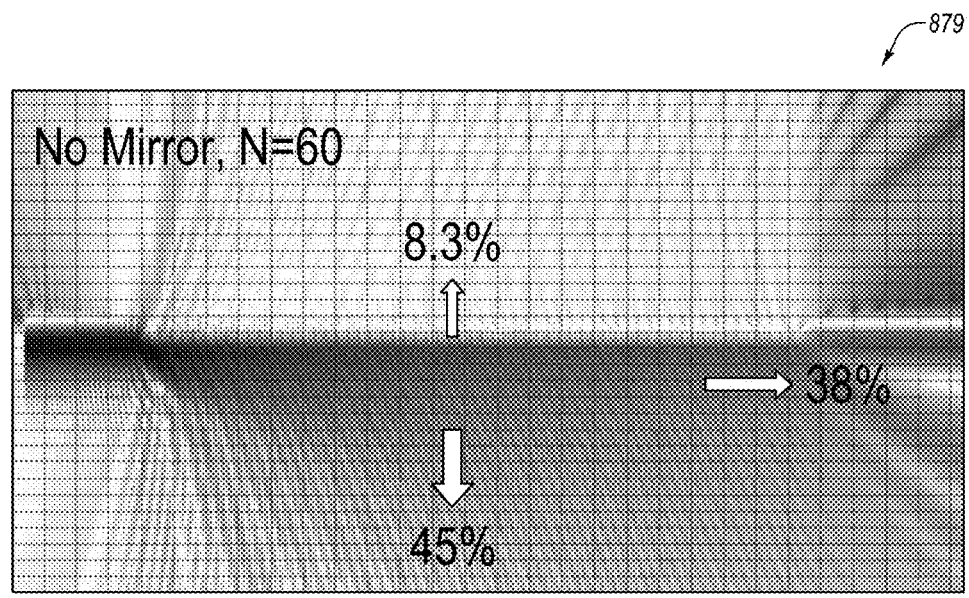
FIGS. 8A and 8B each include a graphical representation of a simulation of light propagation through a passive section.

FIG. 8A is a graphical representation 879 of a simulation of light propagation through a passive section, arranged in accordance with at least one embodiment described herein. The passive section of FIG. 8A may be similar to the passive section 632 discussed in relation to FIG. 6 but without a top mirror (e.g., the top mirror 638). The passive section may also have a short length (e.g., a length less than 30 μm). The passive section may include a first surface grating with a grating period of 462.2 nm. Additionally, the first surface grating may have 60 periods, and a length of 27.7 μm (60 periods×0.462 m=27.7 μm). As can be seen in the graphical representation 879 of FIG. 8A, a significant portion of light (e.g., 8.3% in the example of FIG. 8A) may be lost out of the passive section due to the absence of the top mirror.

Figure 8B:
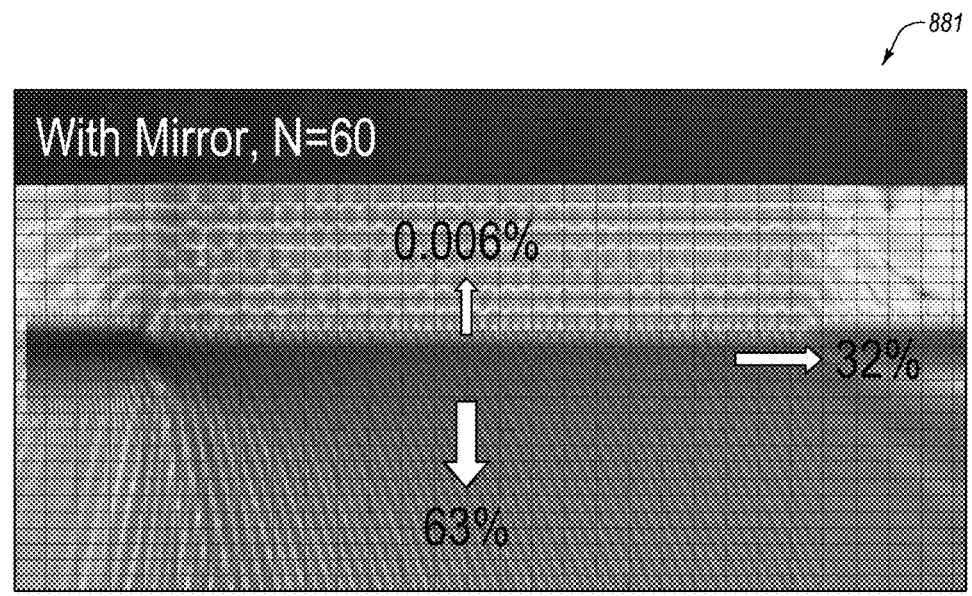

FIG. 8B is a graphical representation 881 of a simulation of light propagation through a passive section, arranged in accordance with at least one embodiment described herein. The passive section of FIG. 8B may be similar to the passive section 632 discussed in relation to FIG. 6 and may include a top mirror, such as the top mirror 638 discussed in relation to FIG. 6 above. The passive section may also have a short length (e.g., a length less than 30 μm). The passive section may include a first surface grating with a grating period of 462.2 nm. Additionally, the first surface grating may have 60 periods, and a length of 27.7 μm (60 periods×0.462 μm=27.7 μm). As can be seen in the graphical representation 881 of FIG. 8B, a relatively greater portion of light may be usable with the light reflecting back down off of the mirror as compared to FIG. 8A.

It can be seen from a comparison of the simulations of FIGS. 8A and 8B that including a top mirror in a passive section may significantly improve a coupling efficiency in the downward direction.

Figure 7:
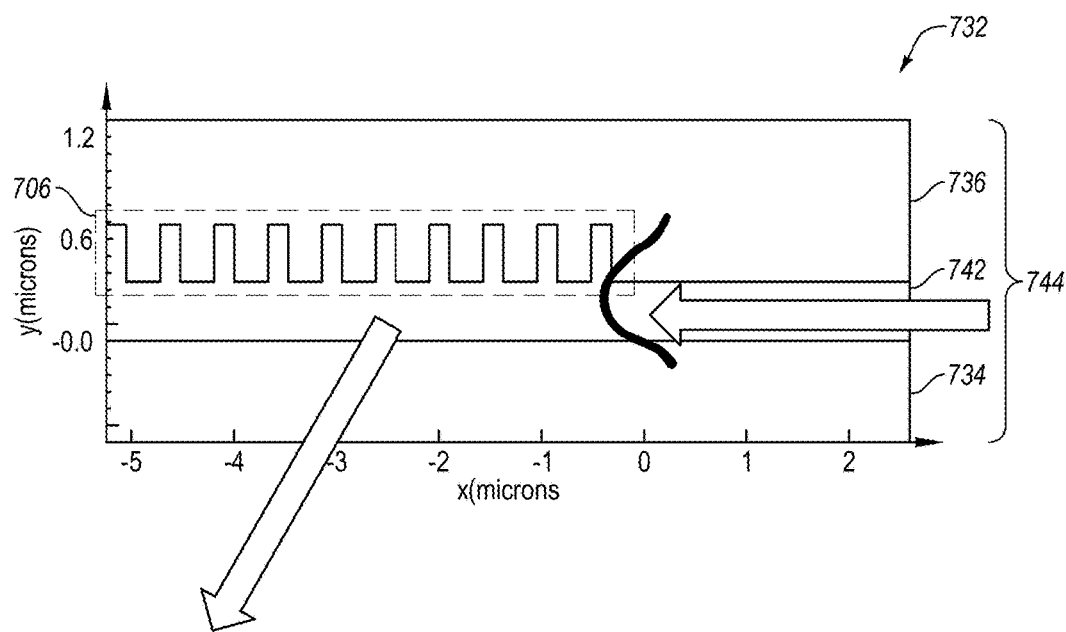
FIG. 7 illustrates a passive section of another example surface coupled edge emitting laser.

FIG. 7 illustrates a passive section 732 of another example surface coupled edge emitting laser (hereinafter "laser"), arranged in accordance with at least one embodiment described herein. The laser that includes the passive section 732 may be implemented in one or more of the surface coupled systems discussed herein. The passive section 732 may include a waveguide core 742 optically coupled to a first diffraction grating 706. The first diffraction grating 706 may correspond to the other first diffraction gratings and/or first surface gratings discussed herein. The passive section 732 may also include a substrate 734 as a bottom cladding beneath the waveguide core 742 and the first surface grating 706, and a top cladding 736 above the waveguide core 742 and the first surface grating 706. The top cladding 736, waveguide core 742, and bottom cladding 734 together may form a waveguide 744. In this example, light beams may propagate through the waveguide 744 in a right to left direction. The light beams may travel in the waveguide 744 until the light beam is diffracted in the direction of the bottom cladding 734 by the first diffraction grating 706. Some or all of the diffracted light beam may propagate through and out of the bottom cladding 734.

In some embodiments, the bottom cladding 734 may include InP with a bottom cladding index of refraction of about 3.2. Alternatively or additionally, the top cladding 736 may include a dielectric such as $SiO_2$ with a top cladding index of refraction of about 1.46, or more generally a dielectric with a top cladding index of refraction in a range from 1-2. Alternatively or additionally, the waveguide core 742 may include InGaAsP (sometimes referred to as $In_xGa_{1-x}As_yP_{1-y}$ to denote the ratios of In, Ga, As, and P) with a core index of refraction that is higher than the bottom cladding index of refraction to guide an optical mode. Varying the variables x and y in the composition $In_xGa_{1-x}As_yP_{1-y}$ varies the material bandgap and hence refractive index and loss.

A wide range of refractive indices for the waveguide core 742 may lead to a guided mode in the waveguide 744. However, in order to achieve high diffraction efficiency of light that is propagated into the far field and can reach a receiver grating in a Si PIC, suitable refractive indices for the waveguide core 742 may be more limited. In more detail, since the first diffraction grating 706 may include repeated periodic regions of InGaAsP that may have a first index of refraction and periodic regions of $SiO_2$ with a second index of refractive, where the first index of refraction is higher than the second index of refraction, a resulting effective index of the first diffraction grating 706 may be reduced relative to the waveguide core 742. As a result, if the effective index of the first diffraction grating 706 becomes similar to or less than an index of refraction for a bottom cladding 734 (e.g., a refractive index of an InP substrate), then light beams diffracting from the first diffraction grating 706 may be leaked into substrate modes and may not diffract into the far field in the desired direction and out of the bottom cladding 734 (e.g., an InP substrate) to reach a receiver grating in a Si PIC which is some working distance away.

Figure 9A:
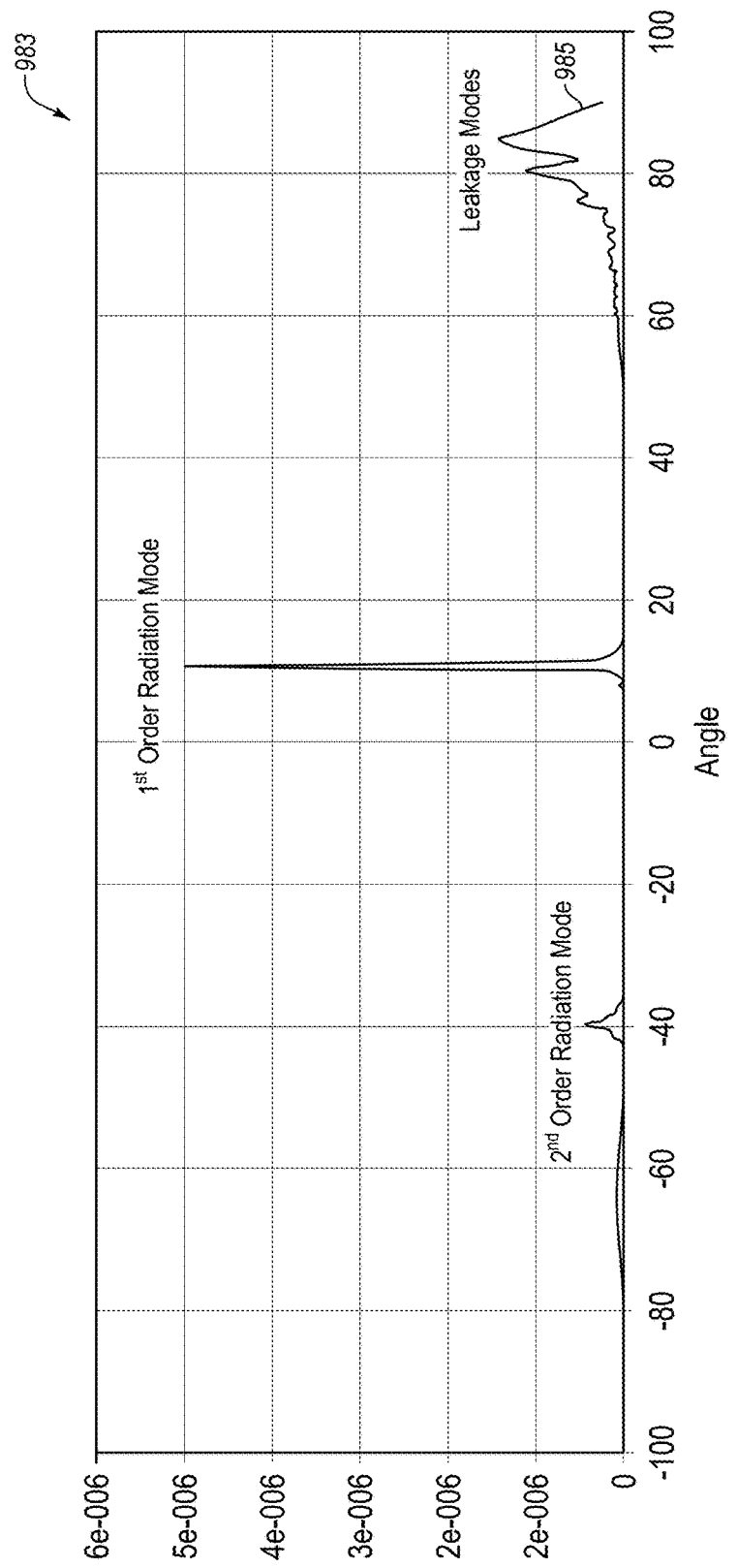
FIG. 9A illustrates a graphical representation of an example far field profile as a function of diffraction angle for a passive section.

FIG. 9A illustrates a graphical representation 983 of an example of a far field profile as a function of diffraction angle for a passive section, such as the passive section 732 discussed in relation to FIG. 7 above, arranged in accordance with at least one embodiment described herein. The passive section may have a core index of refraction of 3.38. As illustrated in FIG. 9A, a large fraction of light may be directed into leaky modes 985 into the substrate and may not diffract into the far field. The passive section may have a reduced coupling efficiency for coupling light from a laser to a Si PIC and may be impractical for a lot of industry uses.

According to at least one embodiment described herein, the core index of refraction may be at least 6% higher than the bottom cladding index of refraction to provide good efficiency such that the effective index of the resulting first diffraction grating is sufficiently higher than the bottom cladding index of refraction (e.g., of the InP substrate) to avoid leakage into the substrate.

Alternatively or additionally, a composition of InGaAsP for a waveguide core with an index of refraction of 3.40 or higher may generally avoid (or at least reduce compared to the simulation 983 of FIG. 9A) leakage into the substrate. However, as the index of refraction increases, it may lead to loss caused by material absorption, so a compromise may be made to, e.g., balance substrate leakage and loss.

Figure 9B:
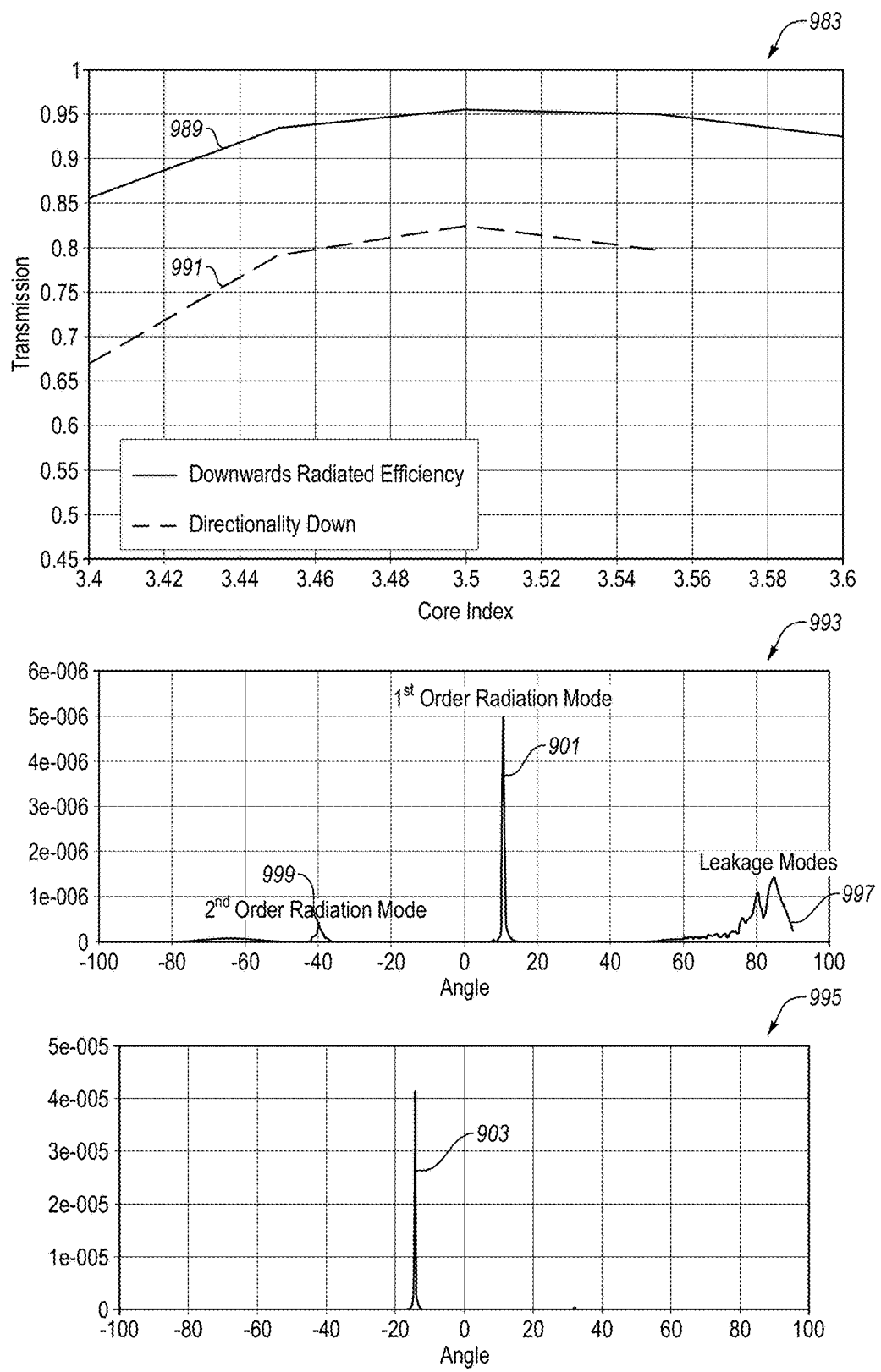
FIG. 9B illustrates various graphical representations of simulations for diffracted light.

FIG. 9B illustrates various graphical representations of simulations for diffracted light, arranged in accordance with at least one embodiment described herein. Graph 987 represents a simulation of diffracted power as a function of a waveguide core index of refraction for a first diffraction grating such as the first diffraction grating 706 of FIG. 7. Curve 989 represents total downward diffracted power as a function of the waveguide core index of refraction for the first diffraction grating. Curve 989 accounts for useful diffracted light (e.g., light actually radiated out of the substrate into the far field) as well as light that has leaked into the substrate but does not exit the substrate. Curve 991 represents far field downward diffracted power as a function of the waveguide core index of refraction for the first diffraction grating. Curve 991 may include only the useful diffracted light that is actually radiated out of the substrate into the far field.

Graph 993 and graph 995 include far field profiles as a function of diffraction angle for two different waveguide core indices of refraction. In the simulation represented in graph 993, the waveguide core may have an index of refraction of 3.38 and much of the light may be lost to leakage at higher diffraction angles (e.g., angles above about 70 degrees) as denoted at 997. As denoted at 999, the simulation in graph 993 includes a second order radiation mode where light may be lost at about a −40 degree diffraction angle. As denoted at 901, the simulation in graph 993 includes a first order radiation mode at a diffraction angle of about 10 degrees. In the simulation represented in graph 993, only about 20 percent of total power may be usable and included in the first order radiation mode. In comparison, in the simulation represented in graph 995, the waveguide core index of refraction may be 3.42 and there is a single radiation mode denoted at 903 at a diffraction angle of about −17 degrees.

The waveguide core index of refraction of an InGaAsP core material may be adjusted by changing the value(s) of x and/or y in the InxGa1−xAsyP1−y material composition (or other material composition) that makes up a waveguide core. Changing the value(s) of x and/or y changes the bandgap of $In_xGa_{1-x}As_yP_{1-y}$, which in turn changes its index of refraction. As index of refraction increases with changes in bandgap, diffraction efficiency decreases due to material absorption. Thus, even though an index of refraction of 3.5 may have a higher far field downward diffracted power than an index of refraction of 3.42, the index of refraction of 3.5 may have too much material absorption loss associated with it compared to the index of refraction of 3.42, leading to an overall lower diffraction efficiency. In one embodiment, a range between 3.4 and 3.44 for the index of refraction of the waveguide core 432 may strike a suitable balance between far field downward diffracted power and diffraction efficiency in some embodiments. In other embodiments, the index of refraction of the waveguide core may be less than 3.4 or greater than 3.44 depending on the particular implementation.

Figure 10:
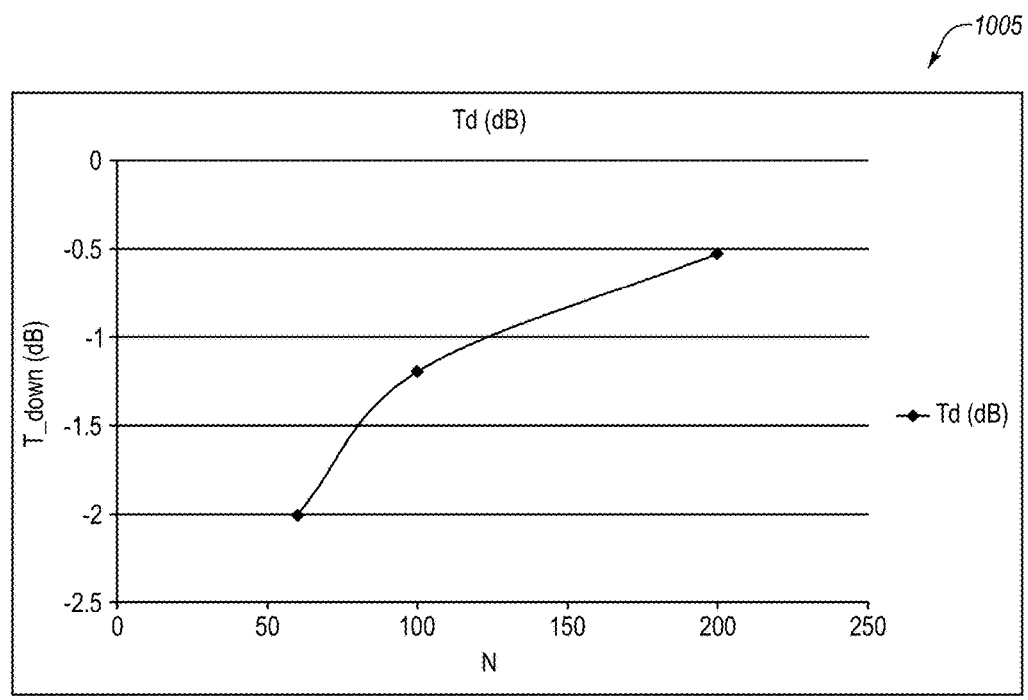
FIG. 10 illustrates a graphical representation of a simulation of diffraction efficiency loss as a function of number N of grating periods of a first surface grating in a passive section with a top mirror.

FIG. 10 illustrates a graphical representation 1005 of a simulation of diffraction efficiency loss as a function of number N of grating periods of a first surface grating in a passive section with a top mirror, such the passive section 632 of FIG. 6, arranged in accordance with at least one embodiment described herein. In the simulation of FIG. 10, a diffraction efficiency loss of 0 dB may equal complete (i.e. one hundred percent) downward diffraction. As can be seen in the graphical representation 1005 of FIG. 10, as the number N of grating periods increase, the diffraction efficiency increases.

Figure 11:
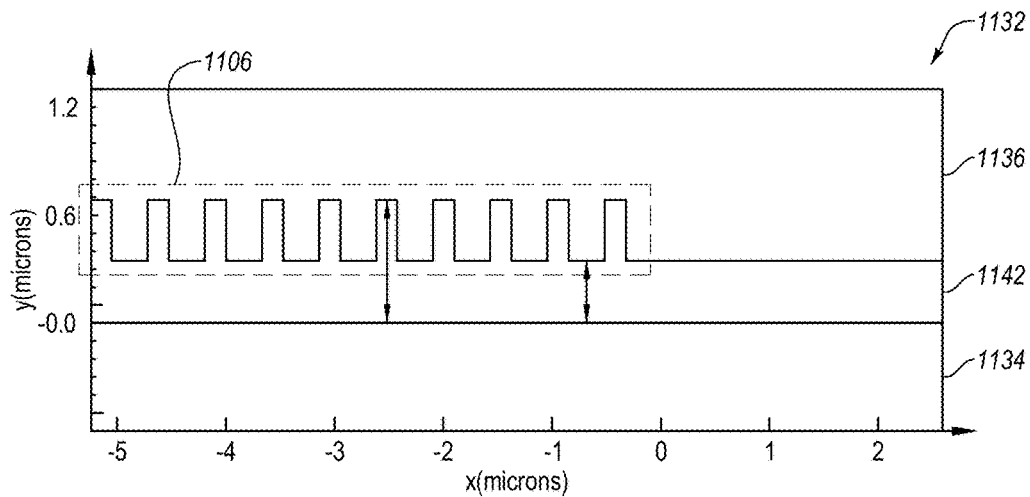
FIG. 11 illustrates another passive section of a laser.

FIG. 11 illustrates another passive section 1132 of a laser, arranged in accordance with at least one embodiment described herein. The laser that includes the passive section 1132 of FIG. 11 may be implemented in one or more of the surface coupled systems discussed herein. The passive section 1132 may include a top cladding 1136 made of SiO2, SiNx, or other suitable cladding material, a waveguide core 1142 and a first surface grating 1106. The first surface grating 1106 may include grating teeth (i.e., alternating material with different indexes of refraction). The first surface grating 1106 and waveguide core 1142 may be made of InGaAsP. Additionally, the passive section 1132 may include a bottom cladding 1134 made of a substrate of InP. In at least one embodiment, the waveguide core 1142 may have a height above the bottom cladding 1134 of about 350 nm, such as 300-380 nm, 325-375 nm or 350 nm. Alternatively or additionally, the grating teeth of the first surface grating 1106 may have a total height measured from a bottom of the waveguide core 1142 to a top of the grating teeth of the first surface grating 1106 of about 650 nm, such as 550-700 nm, 600-680 nm, 650-680 nm, or 673.9 nm. Alternatively or additionally, the grating teeth of the first surface grating 1106 may have a height above the waveguide core 1142 measured from a top of the waveguide core 1142 to the top of the grating teeth of the first surface grating 1106 of about 300 nm, such as 250-350 nm, 310-330 nm, or 323.9 nm.

As illustrated in FIG. 11, the grating teeth of the first surface grating 1106 alternate with cladding teeth of the top cladding 1136 and may therefore have a grating period and/or duty cycle. The grating period may be 525.6 nm, meaning there may be a distance of 525.6 nm between a front of each grating tooth and the front of a subsequent grating tooth. More generally, the grating period may be in a range from 500 nm to 600 nm. In an example embodiment, the first surface grating 1106 may include 120 grating periods. The duty cycle of the first surface grating 1106 may be 0.397, meaning each grating tooth may span 39.7% of each grating period where a corresponding top cladding tooth occupies a remainder of each grating period. More generally, the duty cycle may be in a range from 0.3 to 0.5. In an example embodiment, the first surface grating 1106 or other first surface gratings described herein may include one or more of the following parameters: 120 grating periods, a grating period of 525.6 nm, a duty cycle of 0.397, a total grating tooth height of 673.9 nm, a downward radiation efficiency (DRE) of −0.454 dB, a radiated diffraction angle θ rad of −14.24 degrees, a transmission through the first surface grating of about 3.42%, and reflected power of about −53.6 dB. Here DRE is the useful portion of the light that is radiated out to the far field and is defined as the fraction of power radiated out of the diffraction grating towards the substrate in a small angular window about the radiated diffraction angle □ rad.

Figure 13:
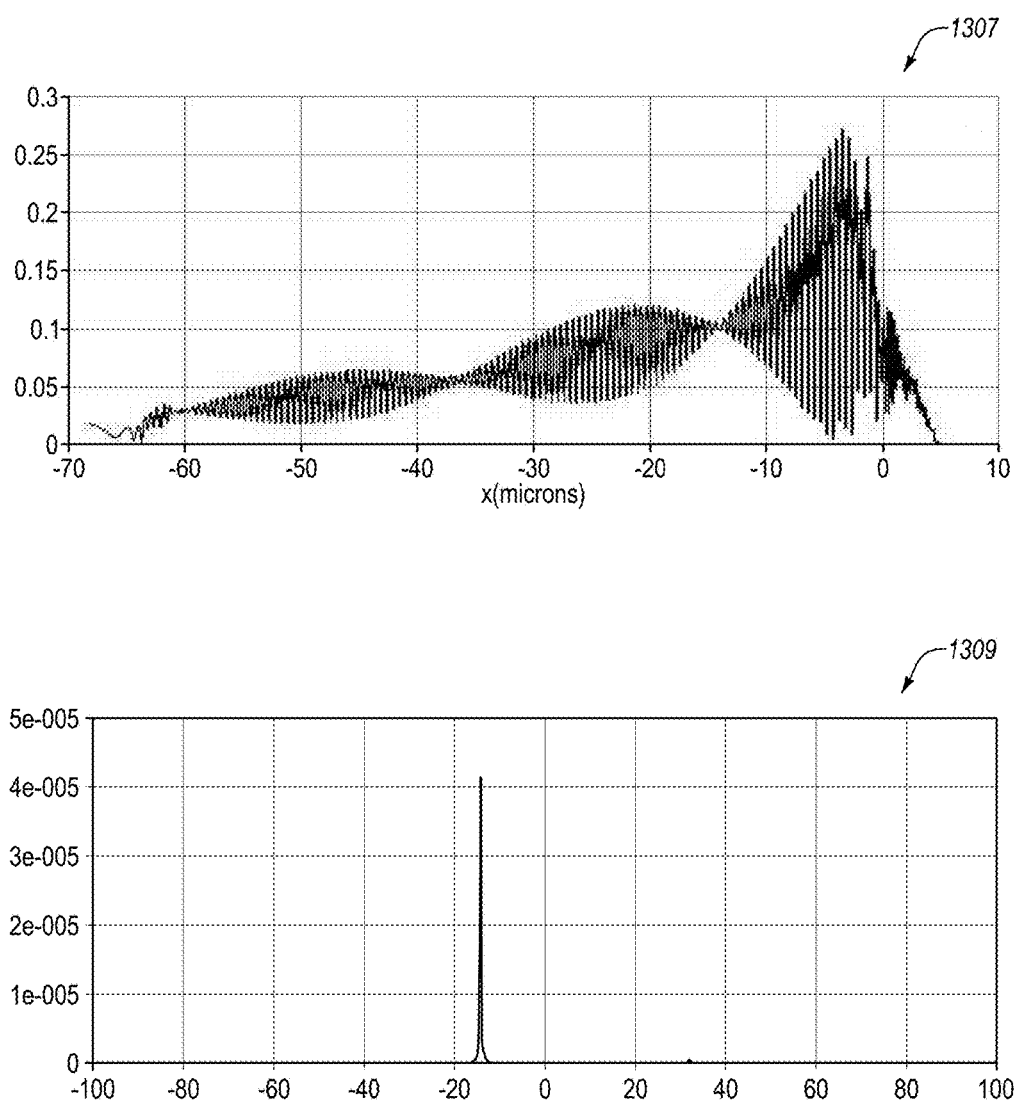
FIG. 13 illustrates various graphical representations of electric field of grating output as a function of location along a length of a first surface grating and a far field profile as a function of diffraction angle of the first surface grating.

FIG. 13 illustrates various graphical representations of the magnitude of electric field of grating output as a function of location along a length of a first surface grating and a far field profile as a function of diffraction angle of the first surface grating, arranged in accordance with at least one embodiment described herein. FIG. 13 includes simulations for a first surface grating such as the first surface grating 706 of FIG. 7 or the first surface grating 1106 of FIG. 11. In more detail, graph 1307 illustrates the magnitude of the electric field of grating output as a function of location along the length of the first surface grating. Graph 1309 illustrates the far field profile as a function of diffraction angle of the first surface grating.

In view of at least FIGS. 7, 9A, 9B, 11, and the associated description, the instant application recognizes various parameters discussed herein and associated with particular designs for the first surface grating that can be included in lasers of one or more surface coupled systems described herein. Embodiments described herein may include one or more of these parameters, which will be discussed in connection with FIG. 11 above. Although some of the parameters discussed above have been specific to InP-based first surface gratings, one or more of the following parameters may be applied to first surface gratings of other material compositions.

First, the total height of the grating teeth may be greater than the height of the waveguide core. Some diffraction gratings are formed by etching down into a waveguide core to form grating teeth such that the height of the waveguide core in areas that do not include the grating teeth is the same as or greater than the total height of the grating teeth. In comparison, according to some embodiments disclosed herein, the height of the waveguide core in areas that do not include the grating teeth is less than the total height of the grating teeth.

Second, the grating tooth index of refraction (e.g., the index of refraction of the grating teeth that extend upward from the waveguide core) may be greater than or equal to the core index of refraction (e.g., the index of refraction of the waveguide core). It may be easier to fabricate the grating teeth from the same material composition as the waveguide core, in which case the grating tooth index of refraction may be the same as the core index of refraction. In other embodiments, the grating teeth may be fabricated from a different material composition than the waveguide core if the grating tooth index of refraction is greater than or equal to the core index of refraction.

Third, an effective index of the first diffraction grating may be sufficiently higher than the bottom cladding index of refraction (e.g., the index of refraction of the bottom cladding/substrate) to avoid leakage of a diffracted optical mode into the substrate. For example, the effective index of the first diffraction grating, which depends on at least the core index of refraction and the top cladding index of refraction (e.g., the index of refraction of the top cladding) may be at least 6% higher than the bottom cladding index of refraction.

Figure 12:
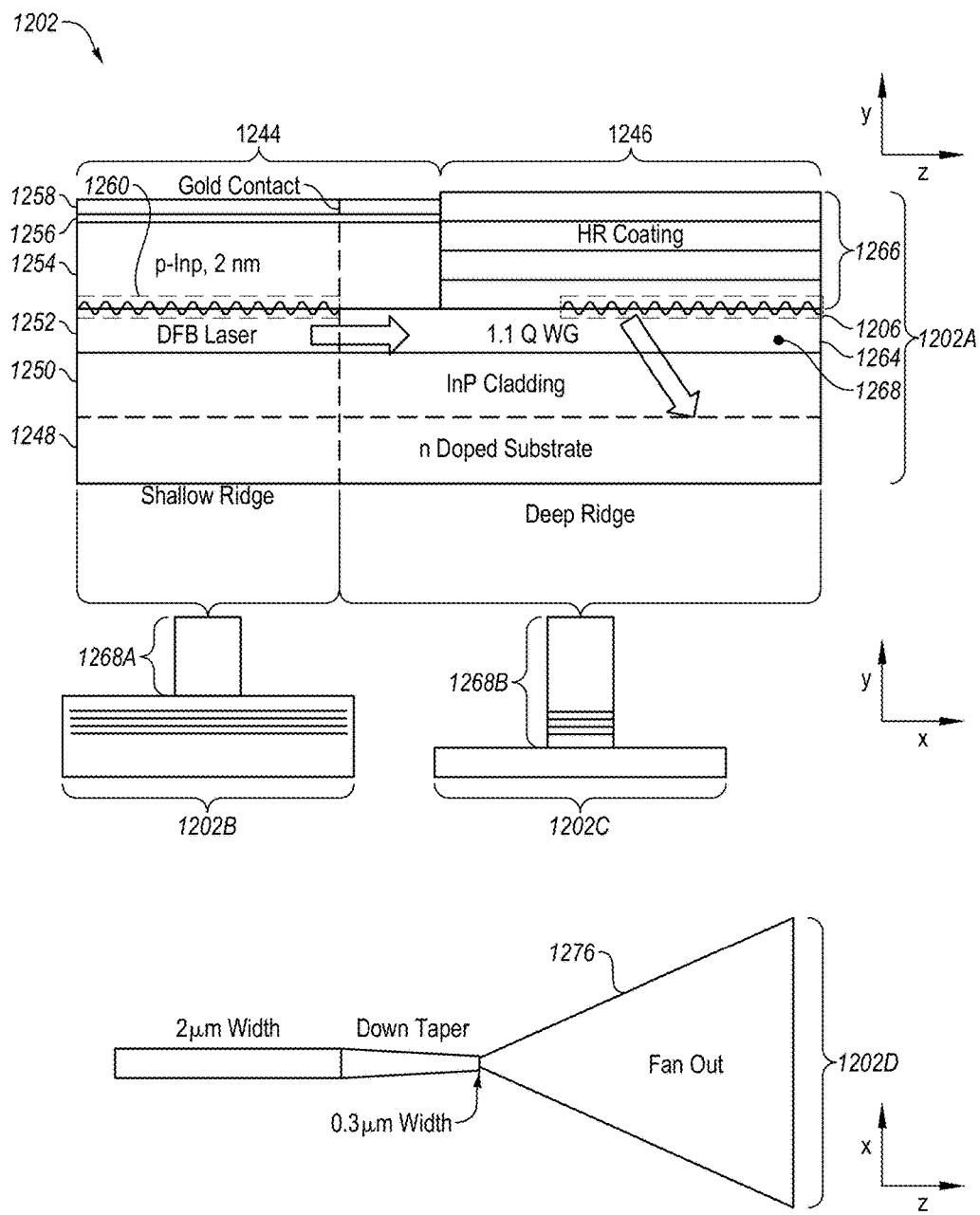
FIG. 12 illustrates a side cross-sectional view, a shallow ridge end-oriented cross-sectional view, a deep ridge end-oriented cross-sectional view, and an overhead view of another example surface coupled edge emitting laser.

FIG. 12 illustrates a side cross-sectional view 1202A, a shallow ridge end-oriented cross-sectional view 1202B, a deep ridge end-oriented cross-sectional view 1202C, and an overhead view 1202D of another example surface coupled edge emitting laser (hereinafter "laser") 1202, arranged in accordance with at least one embodiment described herein. The laser 1202 may be implemented in one or more of the surface coupled systems described herein.

The laser 1202 may include an active section 1244 with an active section ridge structure 1268A and a passive section 1246 with a passive section ridge structure 1268B. The active section 1244 may include, from bottom to top in the side-cross-sectional view 1202A, a substrate 1248 implemented as an n-doped substrate, an InP cladding 1250, a gain layer 1252 implemented as a multiple-quantum well (MQW) and core guiding that may form a DFB laser, a p-InP layer 1254, an InGaAs or other contact layer 1256, and a gold contact 1258. The gain layer 1252 within the active section 1244 may include a MQW sandwiched between upper and lower waveguide layers, with a diffraction grating 1260 formed on the upper waveguide layer.

The passive section 1246 may include, from bottom to top in the side-cross-sectional view, the substrate 1248, the InP cladding 1250, a core waveguide material layer 1264, a first surface grating 1206, and a top mirror 1266 or other HR coating. The core waveguide material layer 1264 includes a core waveguide 1268 coupled end to end with the gain layer 1252, a fan out region 1276 (see overhead view 1202D) coupled end to end with the core waveguide 1268, and a first surface grating 1206 formed at the interface between the core waveguide material layer 1264 and the top mirror 1266. In some embodiments the first surface grating 1206 may be coupled end to end with the fan out region 1276. In some embodiments the first surface grating 1206 may partially overlap the fan out region 1276. In some embodiments the first surface grating 1206 may completely overlap the fan out region 1276. The top mirror 1266 may include multiple dielectric layers of alternating indexes of refraction, a gold top mirror or other suitable top mirror or HR coating.

The active section ridge structure 1268A of the laser 1202 may extend through the active section 1244. The passive section ridge structure 1268B may extend through the passive section 1246. In some embodiments, the active and passive section ridge structures 1268A-B may each have a width of 2 μm. As illustrated in the two end-oriented cross-sectional views 1202B-C the active and passive section ridge structures 1268A-B may have different ridge heights. In some embodiments, the active section ridge structure 1268A may be a shallow ridge with a shorter ridge height than the passive section ridge structure 1268B which may be a deep ridge. The active section ridge structure 1268A may extend down to a depth that is above a depth of the gain layer 1252 or to another one of the layers of the laser 1202. The passive section ridge structure 1268B may extend down to a depth that is below a depth of the gain layer 1252 or to another one of the layers of the laser 1202.

The relatively greater ridge height of the passive section ridge structure 1268B may increase mode confinement. The increased mode confinement may increase diffraction of output light by the first surface grating 1206 and provide a large area mode in a lateral direction. As described above, the fan out region 1276 and/or the first surface grating 1206 may be intended to expand the mode to 8-40 μm or 20-40 μm. The expansion of the mode to 8-40 μm or 20-40 μm may be achieved by forming the first surface grating 1206 as a weak (e.g., small index contrast), long grating in the z direction, where the z direction is the light propagation direction. Strong confinement in x and y by virtue of the passive section ridge structure 1268B may increase diffraction and expand the mode in the x direction. The x direction refers to the lateral direction (e.g., orthogonal to z and left to right in the views 1202B-C) and the y direction refers to the vertical direction (e.g., orthogonal to x and z).

Thus, as described with respect to FIG. 12, surface coupled edge emitting lasers may be implemented as ridge waveguide lasers. In other embodiments, surface coupled edge emitting lasers as described herein may be implemented as buried hetero-structure (BH) lasers. Whether implemented as a ridge waveguide laser or a BH laser, some embodiments of the surface coupled edge emitting lasers described herein may include the first surface grating "bolted" onto the surface coupled edge emitting laser to couple light generated by the surface coupled edge emitting laser out through an upper or lower surface of the surface coupled edge emitting laser.

Figure 14A:
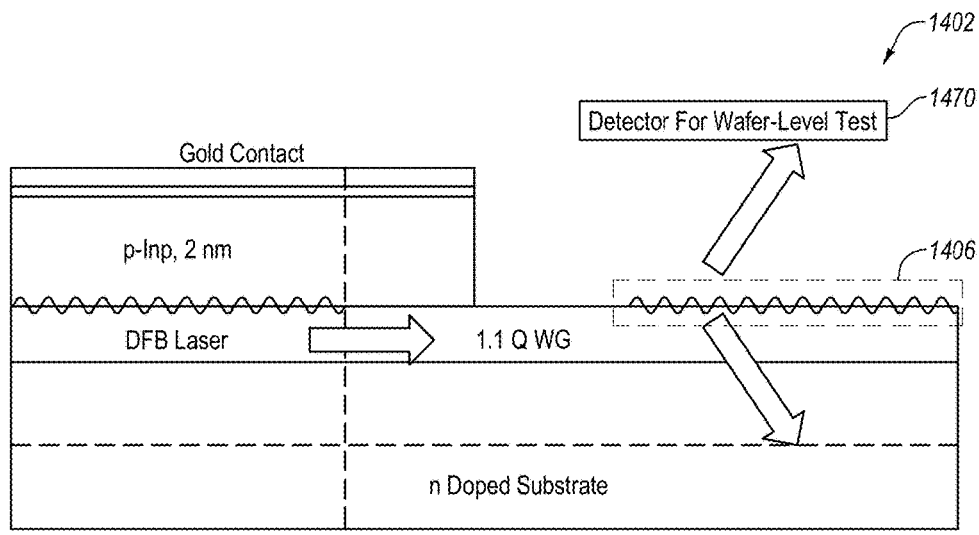
FIG. 14A illustrates a side cross-sectional view of a surface coupled edge emitting laser.

FIG. 14A illustrates a side cross-sectional view of a surface coupled edge emitting laser (hereinafter "laser") 1402, arranged in accordance with at least one embodiment described herein. The laser 1402 may include or correspond to the other lasers described herein.

In more detail, multiple lasers such as the laser 1402 of FIG. 14A may be formed in a wafer and formation of a high reflectivity facet mirror in all of the lasers may be one of the last material additive steps in fabrication of the wafer after it has been diced and singulated to expose the side facets that form the laser cavity. Prior to adding a top mirror to the laser 1402 and the other lasers in the wafer, and/or in embodiments in which a top mirror is omitted altogether, a detector 1470 may be positioned above a first surface grating 1406 of the laser 1402. Since the first surface grating 1406 may diffract light both down through the substrate and upward, the detector 1470 may be positioned above the first surface grating 1406 to measure one or more parameters of an optical beam emitted by the laser 1402, a portion of which optical beam is diffracted up to the detector 1470 by the first surface grating 1406.

A single detector such as the detector 1470 or multiple such detectors may be used to measure parameters of optical beams emitted by multiple lasers in the wafer. All of the lasers in the wafer may be measured simultaneously, one at a time, in groups of two or more, or in some other manner. High reflectivity facet mirrors may be formed on the lasers after the laser chips have been diced from the wafer and singulated, in order to expose the facets that form the laser cavity.

Figure 14B:
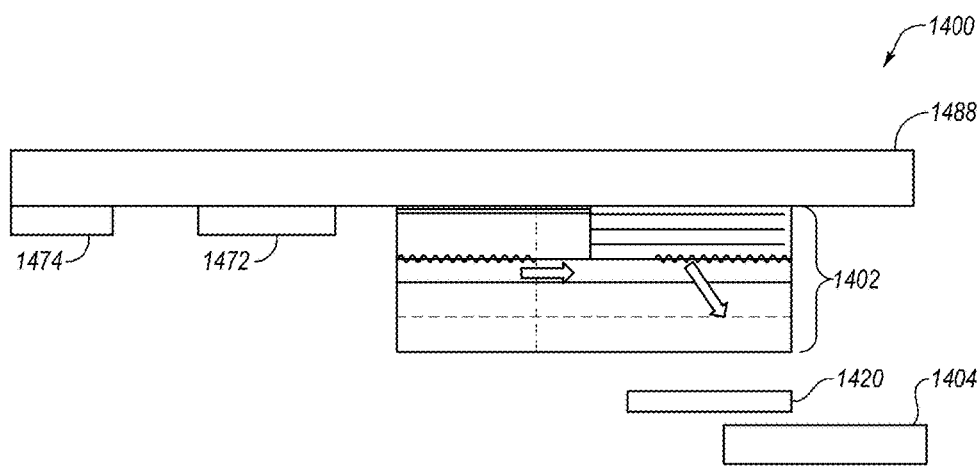
FIG. 14B illustrates another example surface coupled system.

FIG. 14B illustrates another example surface coupled system 1400, arranged in accordance with at least one embodiment described herein. The surface coupled system 1400 includes the laser 1402 of FIG. 14A with a top mirror. The surface coupled system 1400 may also include a Si PIC 1404 and an optical isolator 1420. Each of the Si PIC 1404 and the optical isolator 1420 may respectively include or correspond to the other PICs or optical isolators described herein.

In the example of FIG. 14B, the laser 1402 may be a directly modulated laser (DML) and may be referred to as "DML laser 1402". In particular, a voltage or current supplied to the laser 1402 may be modulated so as to modulate an intensity of an optical beam emitted by the laser 1402. Data may thereby be encoded in the optical beam. In the example of FIG. 8B, the DML laser 1402 may be p-side down, bonded to a high-speed substrate 1488 such as ceramic or Silicon with an appropriate heat sink. In at least one embodiment, a high-speed driver 1472 and/or a clock and data recovery (CDR) 1474 chip may be mounted on the high-speed substrate 1448. One potential benefit of embodiments discussed herein may be that some or all components of the surface coupled system 1400 may be mounted to the high-speed substrate 1448 without needing high accuracy since an alignment tolerance may be low. Without a need for high accuracy, mounting of components in accordance with embodiments discussed herein may allow for high volume assembly at low cost. For example, the DML laser 1402 and/or similar DML lasers may be burned in on sub-mount before assembly onto a Si PIC or other package.

Figure 15:
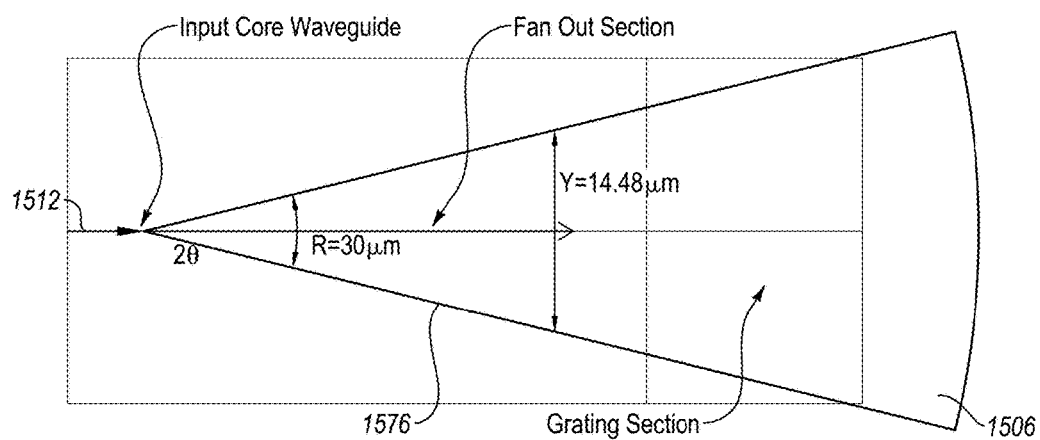
FIG. 15 illustrates an overhead view of a core waveguide, a fan out region, and a first surface grating.

FIG. 15 illustrates an overhead view of a core waveguide 1512, a fan out region 1576, and a first surface grating 1506, arranged in accordance with at least one embodiment described herein. The core waveguide 1512, the fan out region 1576, and the first surface grating 1506 may be included in one or more of the surface coupled edge emitting lasers described herein. Thus, each of the core waveguide 1512, the fan out region 1576, and the first surface grating 1506 may respectively include or correspond to the other core waveguides, fan out regions, or first surface gratings described herein. The fan out region 1576 may be optically coupled to the core waveguide 1532 and the first surface grating 1506. Although not illustrated, one or both of the fan out region 1576 and the first surface grating 1506 may include grating lines corresponding to grating teeth as discussed herein. In an example, the fan out region 1576 may have a length R of about 30 μm and a width Y at its widest point of 14.48 μm.

Figure 16:
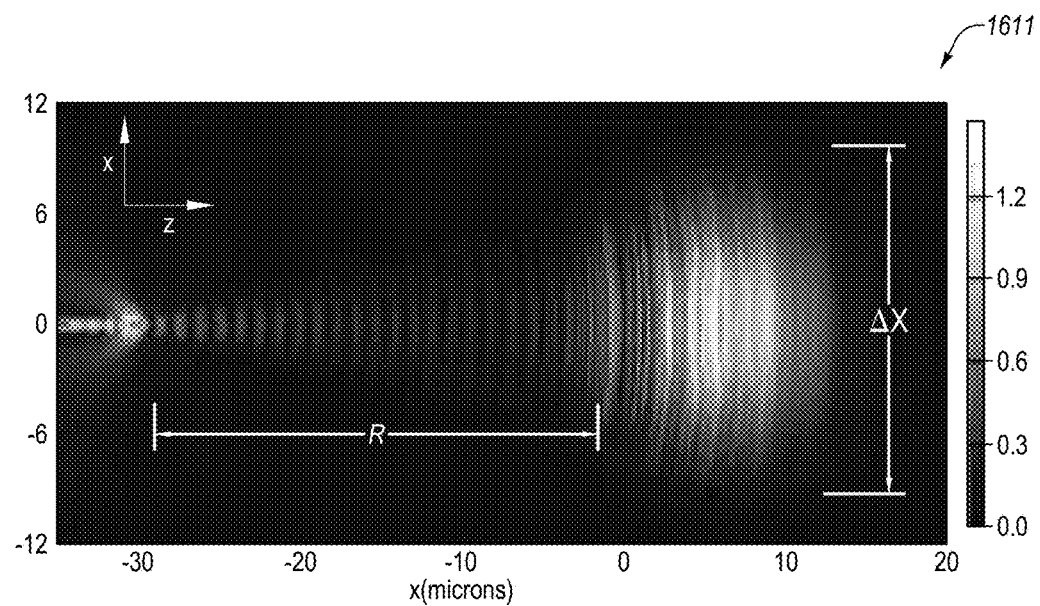
FIG. 16 illustrates a graphical representation of simulated light intensity within the core waveguide, the fan out region, and the first surface grating of FIG. 15.

FIG. 16 illustrates a graphical representation 1611 of simulated light intensity within the core waveguide 1532, the fan out region 1576, and the first surface grating 1506 of FIG. 15, arranged in accordance with at least one embodiment described herein.

According to some embodiments, a first surface grating such as any of the first surface gratings described herein may create a 8-40 μm spot size or even a 20-40 μm spot size. A size of the spot from the first surface grating in an x direction may be determined by diffraction. The diffraction angle and size of mode in the x direction at a distance R may be approximately determined according to equation 5:

$$\theta \sim \frac{\lambda}{\pi n w_0} \quad \Delta x \sim \theta R, \qquad \text{Equation 5}$$

In equation 5, n may be an effective index of refraction of a fan out region of a laser that includes the first surface grating. In equation 5, $w_0$ may be a $1/e^2$ Gaussian mode field radius, and $\lambda$ may be a wavelength of light.

For a shallow ridge, the $1/e^2$ Gaussian mode field radius may be roughly 1 μm. The effective index of refraction of the fan out region of the laser may be 3.5 and the wavelength of light may be 1310 nm. In this embodiment, the diffraction angle θ may be roughly 6.8 degrees. To obtain a 40 μm spot size, for example, the fan out radius may be roughly 335 μm.

For a deep ridge such as the passive section ridge structure 1268B of FIG. 12, the 1/e2 Gaussian mode field radius may be roughly 0.5 μm. The effective index of refraction of the fan out region of the laser may be 3.5 and the wavelength of light may be 1310 nm. In this embodiment, the diffraction angle may be roughly 13.6 degrees. To obtain a 40 μm spot size, the fan out radius may be roughly 167 μm.

Figure 17:
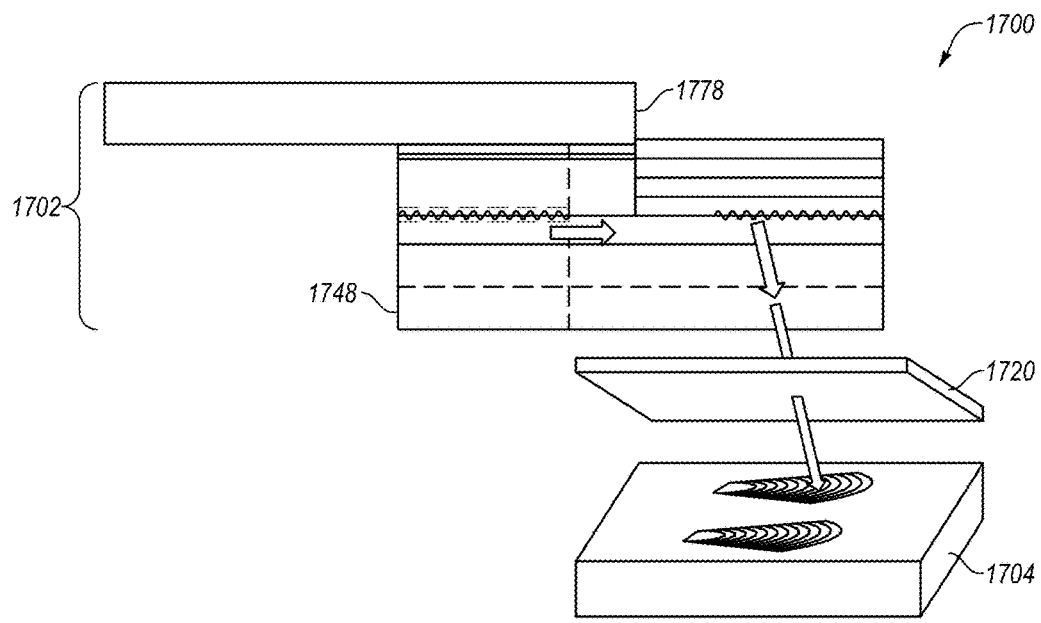
FIG. 17 illustrates another example surface coupled system.

FIG. 17 illustrates another example surface coupled system 1700, arranged in accordance with at least one embodiment described herein. The surface coupled system 1700 may include a surface coupled edge emitting laser (hereinafter "laser") 1702 that may include or correspond to the other lasers described herein. In an example embodiment, the laser 1702 may be similar or identical to the laser 1402 of FIGS. 14A and 14B. The surface coupled system 1700 may also include a Si PIC 1704 that may include or correspond to the other PICs described herein. The surface coupled system 1700 may include an optical isolator 1720 that may include or correspond to the other optical isolators described herein.

In the surface coupled system 1700, a relatively higher resistance of a p side (labeled "p-InP" in FIG. 17) of the laser 1702 may lead to more heat generation on the p side of the laser 1702. Accordingly, a heat sink 1778 may be coupled to the p-side of the laser 1702 to provide better heat sinking. An n doped substrate 1748 of the laser 1702 may be thinned to a few hundred m, to increase a working distance of the laser 1702 and the Si PIC 1704 and reduce a required spot size. Alternatively or additionally, the InP substrate may be semi-insulating.

Figure 18A:
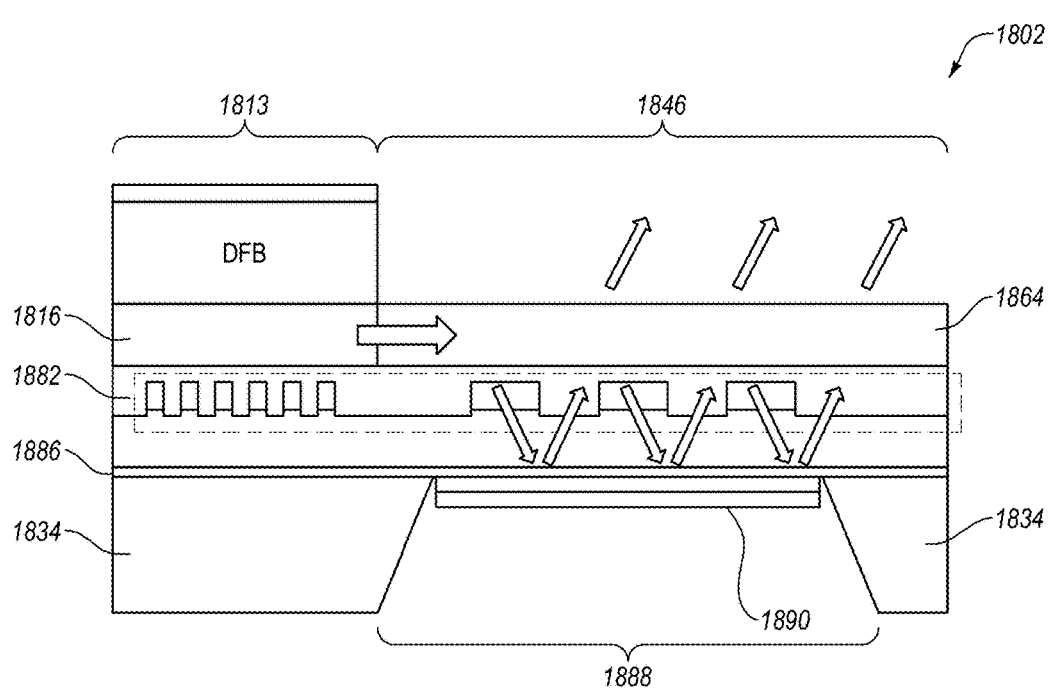
FIG. 18A illustrates another example of a surface coupled edge emitting laser.

FIG. 18A illustrates another example of a surface coupled edge emitting laser (hereinafter "laser") 1802, arranged in accordance with at least one embodiment described herein. The laser 1802 may include or correspond to one or more other lasers described herein. The laser 1802 may be configured to emit light from an epi side or top side of the laser 1802 as opposed to other lasers that emit light from the bottom side of the lasers. The laser 1802 may include a substrate 1834 and an n-side grating 1882, The n-side grating 1882 may be utilized to provide distributed feedback within a DFB laser section 1813 of the laser 1802. The DFB laser section 1813 includes an active gain material waveguide 1816. The n-side grating 1882 is also configured to lie below a passive waveguide portion 1846 of the laser 1802 and is an example of the first surface gratings/transmit gratings described elsewhere herein. The passive waveguide portion 1846 includes a passive core waveguide material 1864 and is adjacent to the DFB laser section 1813. The n-side grating 1882 that is situated under the passive core waveguide 1864 is designed so that the passive waveguide portion 1846 of the laser 1802 will achieve surface radiation emission. Additionally, the laser 1802 may include an HR coating 1890 beneath the n-side grating 1882 under the passive core waveguide 1864 within a window 1888 formed in the substrate 1834.

The portion of the n-side grating 1882 in the passive waveguide portion 1846 of the laser 1802 may diffract light both up and down. The upward diffracted light may be output to a desired component, such as the detector 1470 discussed in relation to FIG. 14 above. The HR coating 1890 may function analogously to the top mirror 638 described in relation to FIG. 6. In particular, the HR coating 1890 may reflect downward diffracted light so the downward diffracted and then reflected light joins the upward diffracted light and is output to the desired component. To ensure the reflected light is received in phase with the light diffracted upward from the first surface grating 1806, the thickness between a bottom of the first surface grating 1806 and the HR coating 1890 may satisfy equation 4, as described above.

Figure 18B:
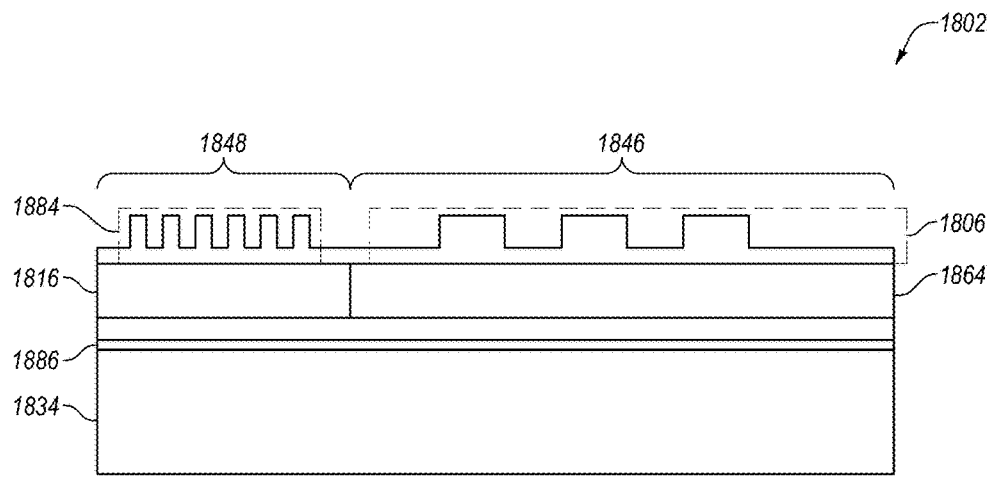
FIGS. 18B and 18C illustrate the laser of FIG. 18A at various processing steps.
Figure 18C:
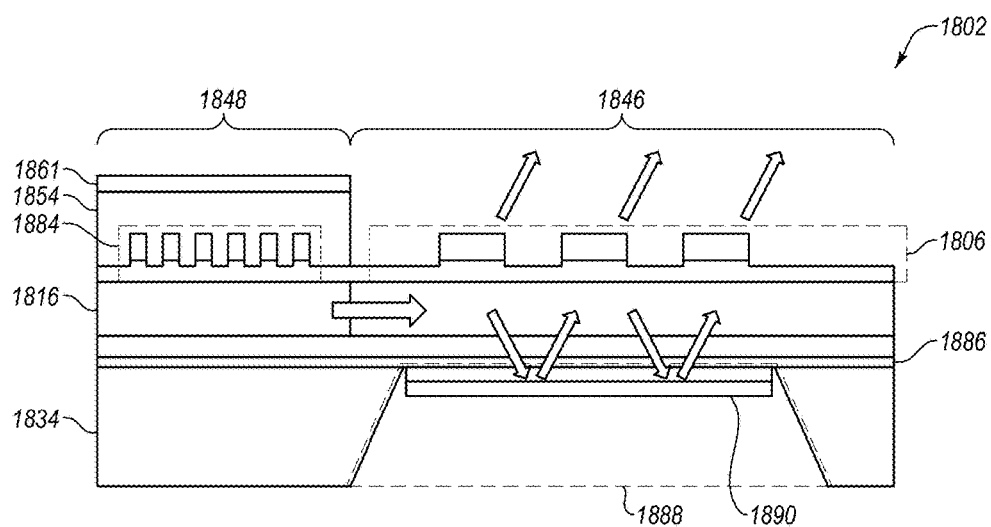

FIGS. 18B and 18C illustrate an alternative embodiment of the laser 1802 that is similar to the laser 1802 illustrated in FIG. 18A, but where a grating 1884 for a DFB laser section 1848 and a grating 1806 for a passive laser section 1846 are instead formed on a top side of the respective active waveguide 1816 (or gain section) and passive waveguide 1864. The grating 1806 is an example of the first surface gratings or transmit gratings described elsewhere herein. The laser 1802 as illustrated in FIG. 18B is the same laser 1802 that is in FIG. 18C, but at an earlier stage in a fabrication process thereof.

The laser 1802 includes the active section 1848 with the grating 1884 implemented as a DFB grating and may be formed above the gain section 1816 of the laser 1802. The gain section 1816 may be formed above a common etch stop layer 1886 located on a substrate 1834. The common etch stop layer 1886 may be common to both the active section 1844 and the passive section 1846 of the laser. The passive section 1846 may include the first surface grating 1806 formed as a p-side grating. The first surface grating 1806 may be formed above the passive core waveguide material layer 1864 which may be formed above the common etch stop layer 1886.

As illustrated in FIG. 18C, one or more layers may be formed above the gain section 1816, such as a p-InP layer 1854 and a p contact 1861 layer. Additionally, within the passive section 1846, a window 1888 may be etched in the substrate 1834. The window 1888 may be formed beneath the surface grating 1806 that is situated in the passive laser section 1846 and up to a bottom surface of the common etch stop layer 1886. A HR coating 1890 may be applied to the common etch stop layer 1886 in the window 1888 beneath the surface grating 1806 to form a bottom mirror.

Light from the DFB section 1848 of the laser 1802 of FIGS. 18B and 18C will enter the passive section 1846 where the surface grating 1806 may diffract light both up and down. The upward diffracted light may be output to a desired component, such as the detector 1470 discussed in relation to FIG. 14 above. The HR coating 1890 may function analogously to the top mirror 638 described above in relation to FIG. 6. In particular, the HR coating 1890 may reflect light upward so the downward diffracted and then reflected light joins the upward diffracted light and is output to the desired component. To ensure the reflected light is received in phase with the light diffracted upward from the first surface grating 1806, the thickness between a bottom of the surface grating 1806 and the HR coating 1890 may satisfy equation 4, as described above.

A high index contrast surface grating (semiconductor to air or semiconductor to dielectric) (e.g., the first surface gratings/transmit gratings described herein) may be more difficult to implement on an n-side than a p-side, but a low index contrast surface grating (semiconductor to semiconductor) may be done with equal ease on the n side or the p side of the laser. In some embodiments described herein, the surface grating 1806 formed in the laser 1802 of FIGS. 18B and 18C may include a high index contrast surface grating, in which case it may be easier to form the surface grating 1806 on the p-side.

Figure 19A:
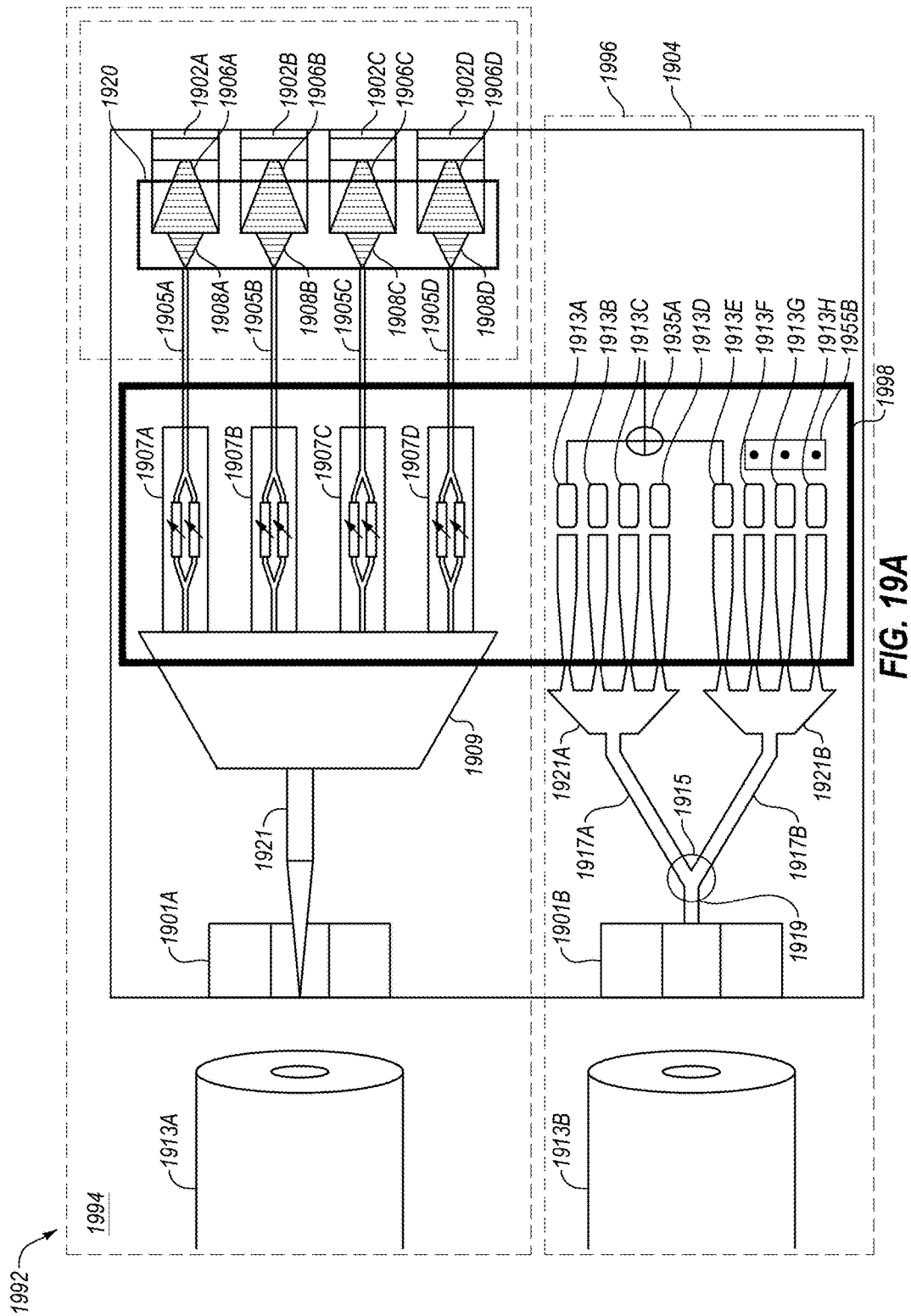
FIGS. 19A and 19B include an overhead view and a side view of an example Si photonic communication module.
Figure 19B:
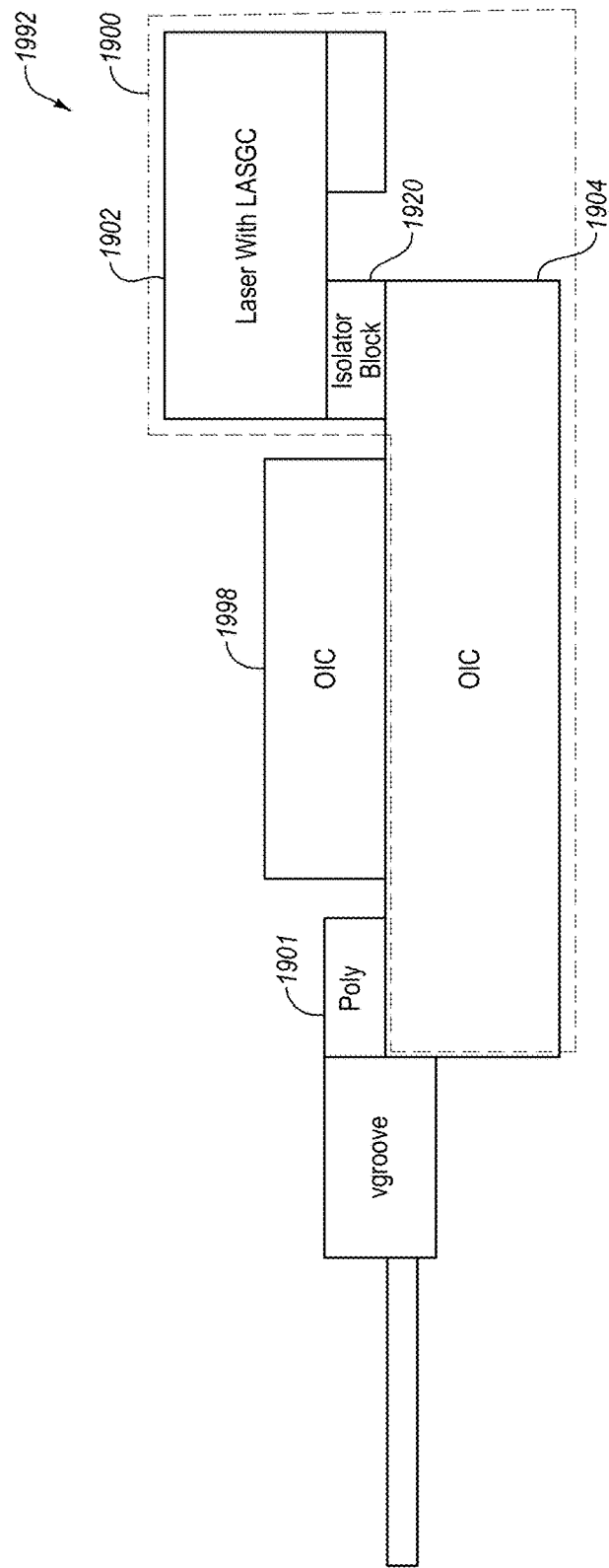

FIGS. 19A and 19B include an overhead view and a side view of an example Si photonic communication module (hereinafter "module") 1992, arranged in accordance with at least one embodiment described herein. The module 1992 may include multiple transmit channels 1994 and multiple receive channels 1996.

The module 1992 may include multiple surface coupled edge emitting lasers (hereinafter "lasers") 1902A-D, each of which may be similar or identical to one or more of the surface coupled edge emitting lasers described herein. The module 1992 may also include a Si PIC 1904 implemented as an optical integrated circuit (OIC), an electrical integrated circuit (EIC) 1998, a first polymer on glass plug 1901A, and a second polymer on glass plug 1901B.

Each of the four lasers 1902A-D may be configured to emit an optical beam at a different one of wavelengths $\lambda 1$, $\lambda 2$, $\lambda 3$, or $\lambda 4$, respectively. For instance, the laser 1902A may be configured to emit an optical beam at wavelength $\lambda 1$, the laser 1902B may be configured to emit an optical beam at wavelength $\lambda 2$, the laser 1902D may be configured to emit an optical beam at wavelength $\lambda 3$, and the laser 1902D may be configured to emit an optical beam at wavelength $\lambda 4$. In other embodiments, different numbers of lasers on different wavelengths may be implemented in the module 1992.

The lasers 1902A-D and the OIC 1904 may form a surface coupled system 1900, similar or identical to other surface coupled systems described herein. In more detail, each of the lasers 1902A-D may have a first surface grating 1906A-D, such as other first surface gratings described herein. The OIC 1904 may include multiple second surface gratings 1908A-D (e.g., one per laser 1902A-D) such as the other second surface gratings described herein. An optical isolator 1920 may be positioned between the first surface gratings 1906A-D of the lasers 1902A-D and the second surface gratings 1908A-D of the OIC 1904. Accordingly, optical beams emitted by the lasers 1902A-D may be redirected downward by the first surface gratings 1906A-D, through the optical isolator 1920 to the second surface gratings 1908A-D, and into one or more Si or SiN waveguides 1905A-D of the OIC 1904 by the second surface gratings 1908A-D.

Thus, in general, each of the optical beams emitted by the lasers 1902A-D may be directed into the OIC 1904. In some examples, each of the Si or SiN waveguides 1905A-D may be coupled to a Mach-Zehnder (MZ) interferometer. One or more drivers, electrical traces, and/or electrodes included in the EIC 1998 may cooperate with the MZ interferometers of the OIC 1904 to form one or more MZ modulators 1907A-D. Data may be modulated onto each of the optical beams by the MZ modulators 1907A-D according to any suitable MZ modulation technique. In other embodiments, the MZ modulators 1907A-D or other external modulator may be omitted and each of the lasers 1902A-D may include a directly modulated laser such that each of the lasers 1902A-D may emit an optical signal, rather than an unmodulated optical beam, into the OIC 1904.

The optical signals may be received at a multiplexer (hereinafter "mux") 1909, which multiplexes the optical signals onto a common waveguide 1911 as a multiplexed signal. In at least one embodiment, the mux 1909 may be a SiN mux and the common waveguide 1911 may be a SiN waveguide. The multiplexed signal may be adiabatically coupled into a transmit optical fiber 1913A through the first polymer on glass plug 1901A.

Alternatively or additionally, another multiplexed signal may be received from a receive optical fiber 1913B at the second polymer on glass plug 1901B and adiabatically coupled through the second polymer on glass plug 1901B into another common waveguide 1919. A Si PIC polarization splitter 1915 or other suitable polarization splitter may split the multiplexed signal according to polarization and may direct a TE polarization mode of the multiplexed signal through a first arm 1917A and a TM polarization mode of the multiplexed signal through a second arm 1917B. Each of the TE and TM polarization modes of the multiplexed signal may be demultiplexed by a corresponding demultiplexer (hereinafter "demux") 1921A-B to generate multiple receive optical signals in each polarization mode. Alternatively or additionally, the TM polarization mode may be converted to TE polarization before reaching the demux 1921A. In at least one embodiment, each demux 1921A-B may include a SiN demux.

Each receive optical signal may be received by a corresponding optical receiver 1913A-H. In at least one embodiment, each optical receiver 1913A-H may include a germanium (Ge) positive-intrinsic-negative (pin) photodiode (hereinafter "Ge pin"). Each optical receiver 1913A-H may generate an electrical signal representative of the corresponding receive optical signal. The corresponding electrical signals may be directed into the EIC 1998. The EIC 1998 may include multiple electrical signal adders 1935A-B, only one of which is illustrated in FIG. 19A for simplicity, the others being denoted by ellipses at 1935B. Each electrical signal adder 1935A-B may add an electrical signal that represents an optical receive signal from the first arm 1917A with an electrical signal that represents a corresponding optical receive signal from the second arm 1917B to generate an output electrical signal representative of a corresponding wavelength channel from the multiplexed signal received at the Si PIC polarization splitter 1915.

Figure 20A:
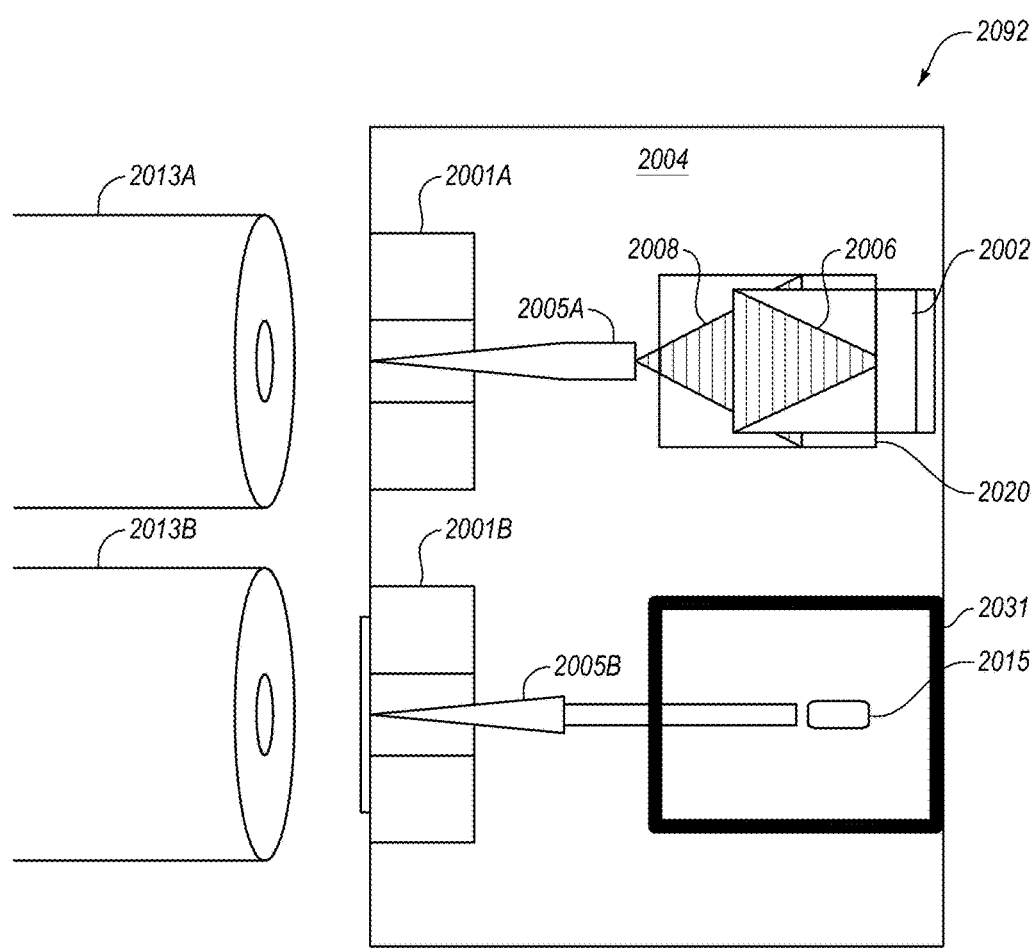
FIG. 20A illustrates another example Si photonic communication module.

FIG. 20A illustrates another example Si photonic communication module (hereinafter "module") 2092, arranged in accordance with at least one embodiment described herein. The module 2092 may include a surface coupled edge emitting laser (hereinafter "laser") 2002. In at least one embodiment, the laser 2002 may be implemented as a DML. The module 2092 may also include a Si PIC 2004, a first glass waveguide plug 2001A, a second glass waveguide plug 2001B, an optical receiver 2015, and a trans-impedance amplifier (TIA)/clock and optional data recovery (CDR) integrated circuit (IC) 2031. The first and second glass waveguide plugs 2001A and 2001B are examples of interposers as described in the '815 application. The first and second glass waveguide plugs 2001A and 2001B may each include glass. In other embodiments, polymer waveguide plugs may be implemented as interposers in the module 2092.

The laser 2002 and the Si PIC 2004 may form a surface coupled system, similar or identical to the other surface coupled systems described herein. In more detail, the laser 2002 may include a first surface grating 2006 similar or identical to the other first surface gratings described herein and the Si PIC 2004 may include a second surface grating 2008 similar or identical to the other second surface gratings described herein. An optical isolator 2020 may be positioned between the first surface grating 2006 and the second surface grating 2008. Accordingly, an optical signal emitted by the laser 2002 may be redirected toward the Si PIC 2004 by the first surface grating 2006, through the optical isolator 2020 to the second surface grating 2008, and into a first waveguide 2005A of the Si PIC 2004 by the second surface grating 2008, which first waveguide 2005A may be a SiN waveguide or a Si waveguide. In at least one embodiment, the first waveguide 2005A may be implemented as a Si waveguide if the second surface grating is Si/SiO$_2$ or as a SiN waveguide if the second surface grating is SiN.

In at least one embodiment in which the first waveguide 2005A is a Si waveguide, the optical signal may be adiabatically coupled from the first waveguide 2005A into a SiN waveguide of the Si PIC 2004 before being adiabatically coupled from the SiN waveguide to a waveguide of the first glass waveguide plug 2001A. Adiabatic coupling is described in the '815 application. In embodiments in which the first waveguide 2005A is a SiN waveguide, the optical signal may be adiabatically coupled directly from the first waveguide 2005A into the waveguide of the first glass waveguide plug 2001A. The optical signal in the first glass waveguide plug 2001A may be butt-coupled into a transmit optical fiber 2013A.

Another optical signal may be received from a receive optical fiber 2013B at the second glass waveguide plug 2001B and adiabatically coupled through the second glass waveguide plug 2001B into a second waveguide 2005B implemented as a SiN waveguide, which may adiabatically couple the light into a Si waveguide which, in turn, guides the optical signal to an optical receiver 2015. In at least one embodiment, the optical receiver 2015 may include a germanium positive-intrinsic-negative (Ge pin) or other suitable optical receiver. The optical signal may be received by the optical receiver 2015, which may generate an electrical signal representative of the optical signal. The electrical signal may be directed into the TIA/CDR IC 2031 which may amplify, reshape, and/or retime the electrical signal or otherwise process the electrical signal.

In an example implementation, the optical signal received from the receive optical fiber 2013B may experience a two-stage adiabatic transition from a second waveguide of the second glass waveguide plug 2001B to a SiN waveguide to a Si waveguide that carries the optical signal to the optical receiver 2015. One or more other optical signals or optical beams may analogously undergo two-stage adiabatic transitions from an interposer waveguide (such as the second glass waveguide plug 2001B) to a SiN waveguide to a Si waveguide, or vice versa. In addition, some embodiments have been described herein as including polymer on glass plugs or glass waveguide plugs, both of which are examples of interposers that may be implemented according to some embodiments. Additional details regarding two-stage adiabatic transitions and interposers that may be suitable for embodiments described herein are described in the '815 application.

Figure 20B:
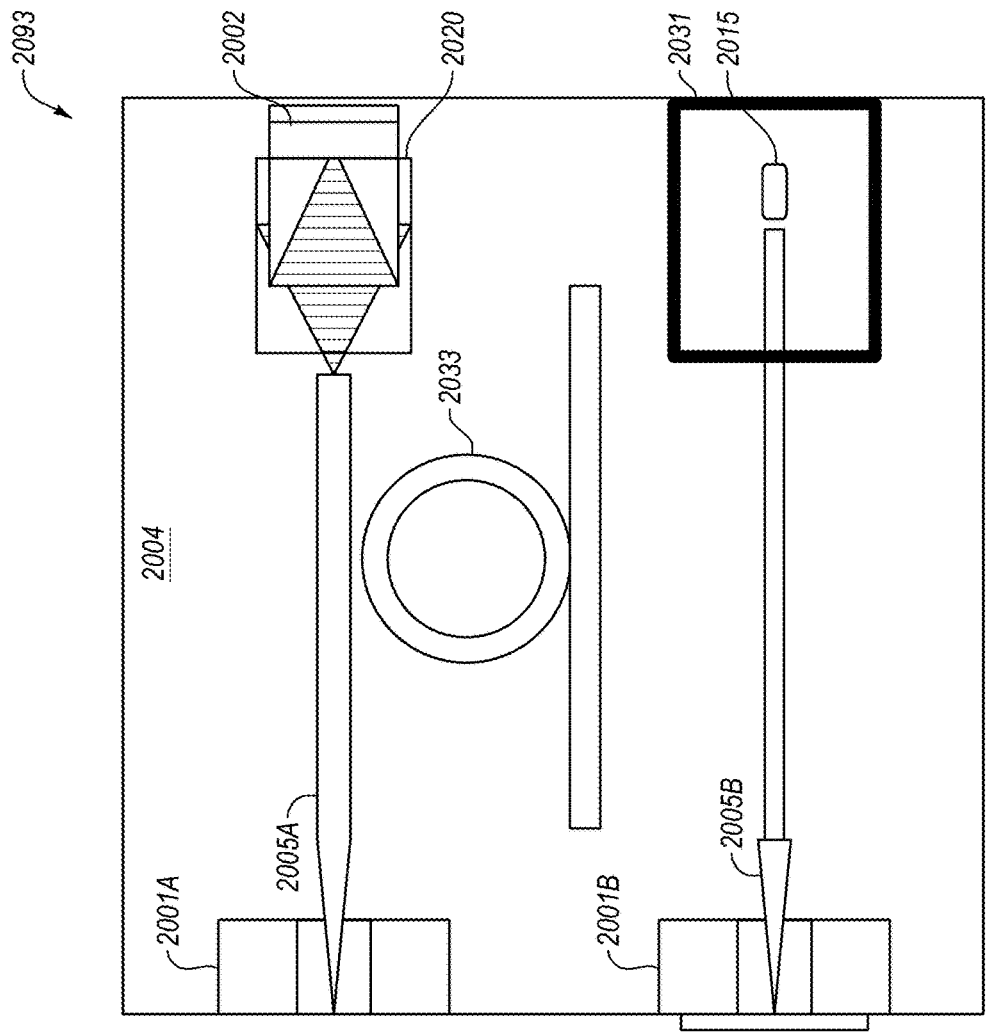
FIG. 20B illustrates another example Si photonic communication module.
Figure 20B:
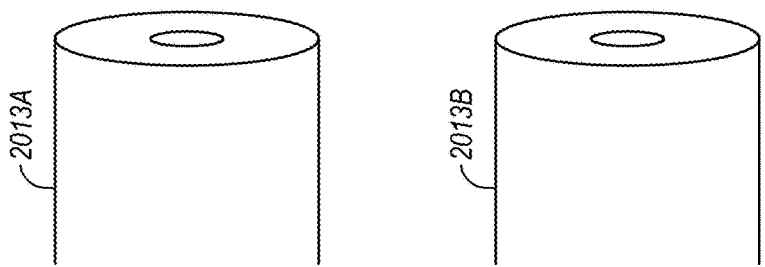

FIG. 20B illustrates another example Si photonic communication module (hereinafter "module") 2093, arranged in accordance with at least one embodiment described herein. The module 2093 is similar or identical in many respects to the module 2092 of FIG. 20A and includes, for instance, the laser 2002, the Si PIC 2004, the glass waveguide plugs 2001A, 2001B, the optical receiver 2015, the isolator block 2020, the TIA/CDR IC 2031, and the first and second waveguides 2005A, 2005B. In comparison to FIG. 20A, the module 2093 additionally includes an optical spectrum reshaper (OSR) 2033 that together with the directly modulated laser 2002 forms a laser with managed chirp, examples of which are marketed by FINISAR CORP. under the name chirp managed laser or CML.

In a laser with managed chirp, the laser 2002 outputs an amplitude modulated optical signal that also has frequency modulation to the OSR 2033. The OSR 2033 may be integrally formed in the Si PIC 2004. The OSR 2033 may convert frequency modulation of the optical signal to amplitude modulation to improve extinction ratio. The OSR 2033 may additionally introduce phase correlation between bits of the optical signal to improve dispersion tolerance. Aspects of an example laser with managed chirp are described in U.S. application Ser. No. 11/968,581, filed on Jan. 2, 2008, which is incorporated herein by reference.

Figure 21:
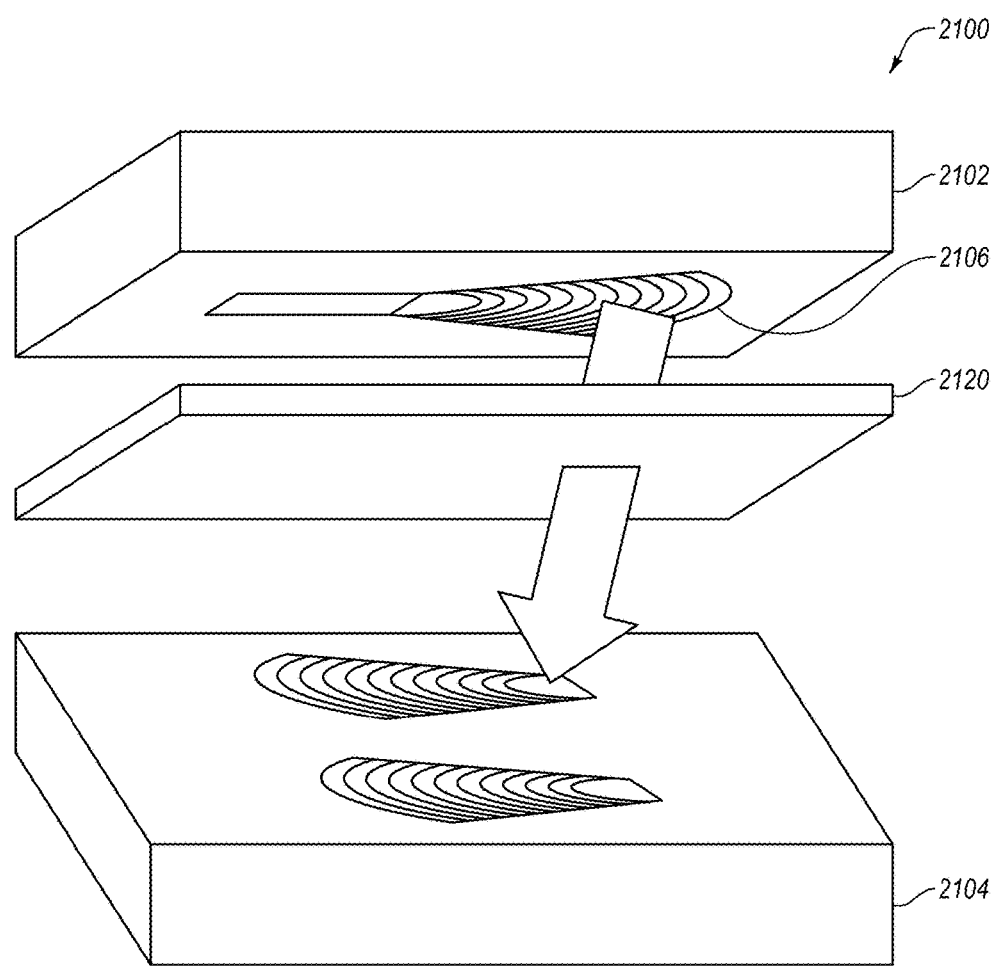
FIG. 21 illustrates another example surface coupled system.

FIG. 21 illustrates another example surface coupled system 2100, arranged in accordance with at least one embodiment described herein. The system 2100 may include a surface coupled edge emitting laser (hereinafter "laser") 2102, an optical isolator 2120, and a Si PIC 2104. Each of the optical isolator 2120 and the Si PIC 2104 may be similar or identical to the other optical isolators and Si PICs described herein. In at least one embodiment, the laser 2102 may be implemented as a hybrid laser.

The laser 2102 may be formed in an InP wafer bonded to a Si substrate, where InP provides gain and passive mirrors (e.g., Si reflection gratings) are formed in Si in or on the Si substrate. Light may be coupled from the InP to Si waveguides (not illustrated) within or on the Si substrate by adiabatic coupling or evanescent coupling. Light may be coupled from the InP to the Si waveguide using a small area surface grating coupler (not illustrated) which will be discussed in further detail with respect to FIG. 22. Light may also be coupled from the InP to the Si waveguide using edge coupling, which will be discussed in further detail with respect to FIG. 23.

A small area surface grating coupler may typically be 10-20 µm long and may be optimized to generate a far-field mode that matches a single mode optical fiber, e.g., with a 10 µm mode field diameter. As such, optical beams from a small area surface grating may have a lens-free working range of 50 µm, which may not allow for placement of an optical isolator 2120. One potential issue with embodiments through free space with such a relatively short lens-free working range is that these embodiments may require lenses to accommodate an optical isolator. Such small area surface grating couplers may also have a relatively large 20-30 nm wavelength bandwidth and may be used to couple light into a Si waveguide from a DFB laser using lenses and/or to couple light out of the Si waveguide into a fiber using lenses.

Embodiments described herein, however, may use one or more LASGs to allow a mode size of 8-40 µm or even 20-40 µm. Accordingly, the laser 2102 may additionally include a first surface grating 2106 formed therein to couple light out of the laser 2102 with a 8-40 µm spot size or even a 20-40 µm spot size that emits light vertically out of the laser 2102. Increasing mode size may increase the lens-free working distance to 300-600 µm, which may be large enough to accommodate the optical isolator 2120 without lenses.

Figure 22:
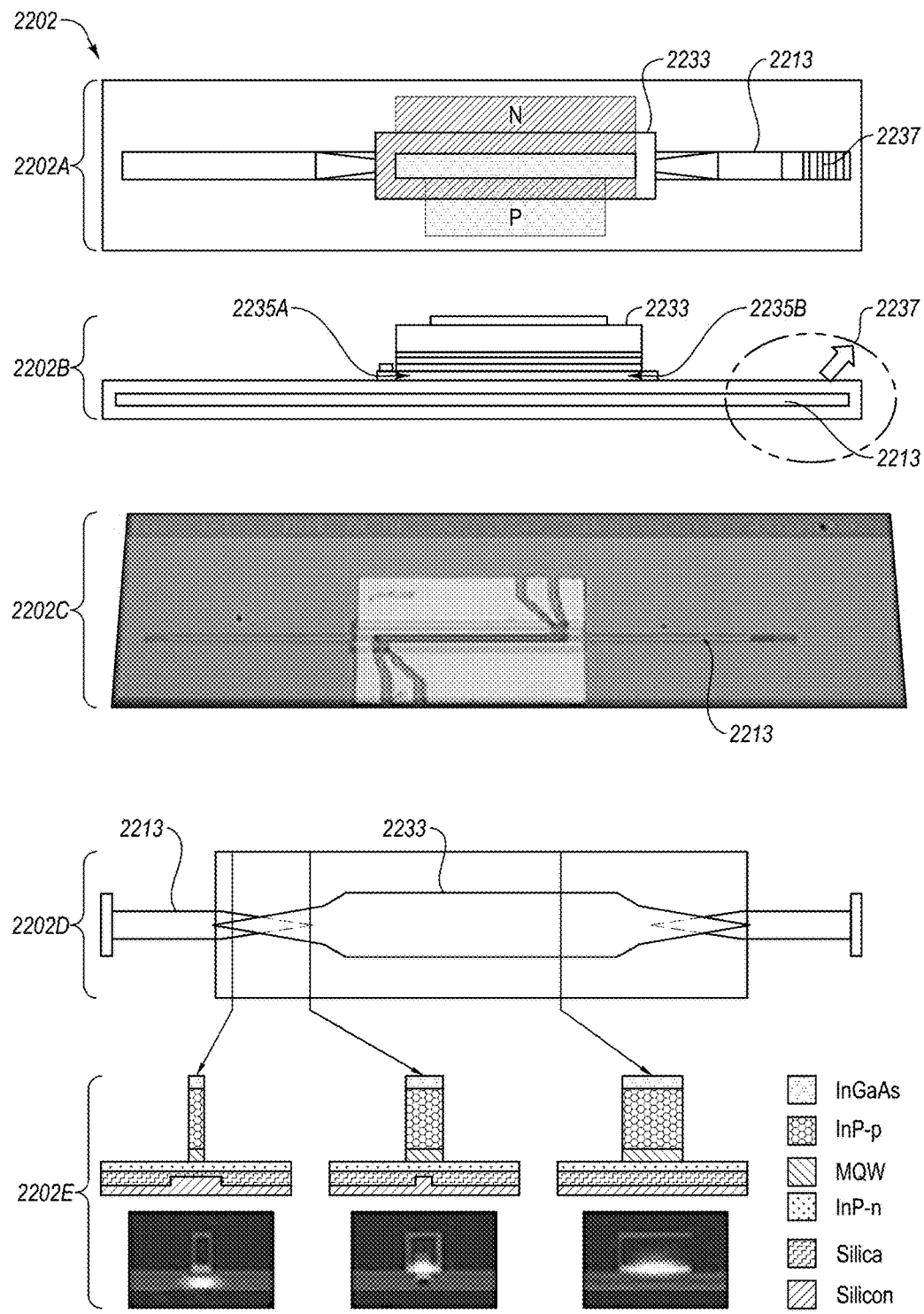
FIG. 22 illustrates various views of an example surface coupled edge emitting laser that may be implemented in the surface coupled system of FIG. 21.

FIG. 22 illustrates various views of an example surface coupled edge emitting laser (hereinafter "laser") 2202 that may be implemented in the surface coupled system of FIG. 21, arranged in accordance with at least one embodiment described herein. In at least one embodiment, the laser 2202 may be implemented as a hybrid laser. FIG. 22 includes a first top view 2202A of the laser 2202, a side view 2202B of the laser 2202, an optical microscope image 2202C of the laser 2202, a second top view 2202D of the laser 2202, and three cross-sectional views 2202E of the laser 2202.

Light may be coupled between a waveguide 2213 and an InP layer 2233 by one or more small area surface grating couplers 2235A-B (side view 2202B only). In at least one embodiment, the waveguide 2213 may be implemented as a Si waveguide. An output coupler 2237 may couple light out of the laser 2202. In some prior implementations of hybrid lasers such as the laser 2202, the output coupler 2237 might include a small area surface grating coupler. According to embodiments described herein, however, the output coupler 2237 may include a LASG, such as the first surface gratings described herein.

Figure 23:
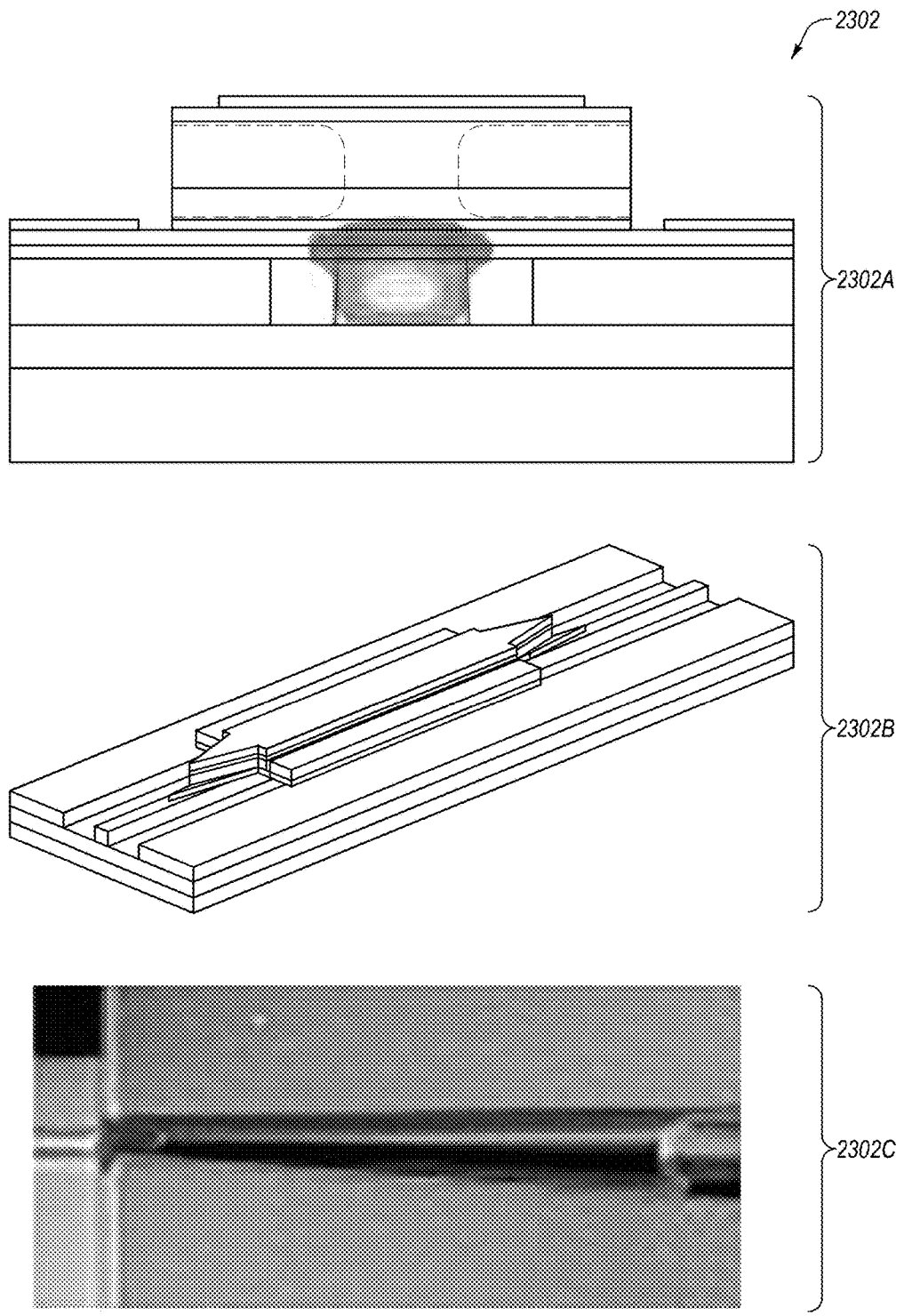
FIG. 23 illustrates various views of another example surface coupled edge emitting laser that may be implemented in the surface coupled system of FIG. 21.

FIG. 23 illustrates various views of another example surface coupled edge emitting laser (hereinafter "laser") 2302 that may be implemented in the surface coupled system 2100 of FIG. 21, arranged in accordance with at least one embodiment described herein. FIG. 23 includes first, second, and third views of the laser 2302. The first is labeled (a) and includes a cross-sectional view of the laser 2302 as a hybrid Si evanescent device. The second view is labeled (b) and includes a schematic view of a transition taper of a passive silicon waveguide to an active hybrid section and vice versa of the laser 2302. The third view is labeled (c) and includes a scanning electron microscope (SEM) image of a taper of the laser 2302. Although not illustrated in FIG. 23, the laser 2302 may include a LASG, such as any of the first surface gratings described herein, to couple light out of the Si substrate of the laser 2302.

Figure 24:
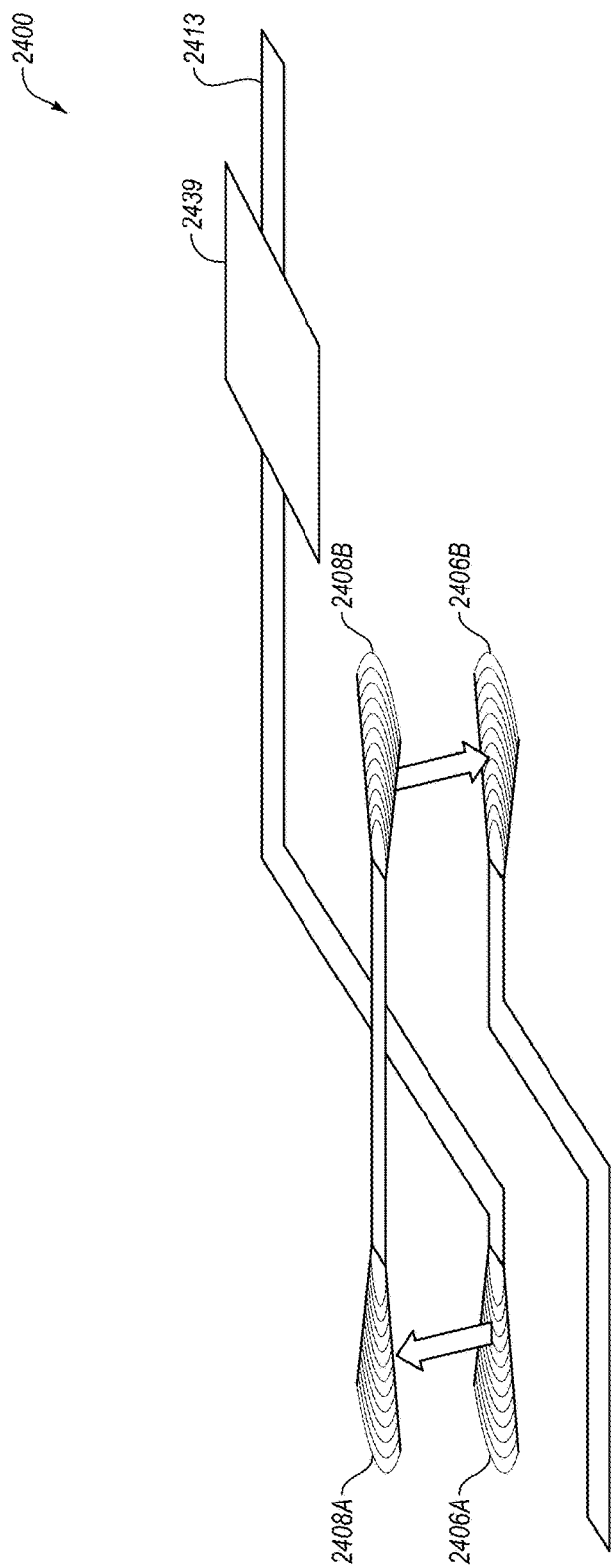
FIG. 24 illustrates another example surface coupled system.

FIG. 24 illustrates another example surface coupled system 2400, arranged in accordance with at least one embodiment described herein. The surface coupled system 2400 may include an input Si waveguide 2413, a Si optical circuit 2439, and first and second LASGs 2408A-B (such as the second surface gratings described herein). The surface coupled system 2400 additionally may include a semiconductor optical amplifier (SOA) 2441 with a third and fourth LASG 2406A-B (such as the first surface gratings described herein) at each end of the SOA 2441.

Si photonic components may suffer from high optical loss. In the example of FIG. 24, the SOA 2441 may be curved (or not curved) and may be coupled to a Si PIC to provide gain and compensate loss. One optical isolator (not illustrated) may be positioned between the first LASG 2408A and the third LASG 2406A and another optical isolator may be positioned between the second LASG 2408B and the fourth LASG 2406B.

Thus, FIG. 24 illustrates a system 2400 that includes a surface coupled edge emitting optical amplifier implemented as the SOA 2441 with the third and fourth LASs 2406A-B at opposite ends thereof as well as a PIC that includes the input Si waveguide 2413 and an output Si waveguide (not labeled). The input Si waveguide 2413 is optically coupled to the first LASG 2408A. The second LASG 2408B is optically coupled to the output Si waveguide.

In the example of FIG. 24, the first LASG 2408A of the PIC may have a working distance of at least 50 μm. Alternatively or additionally, the second LASG 2406B of the SOA 2441 may have a working distance of at least 50 μm.

Figure 25A:
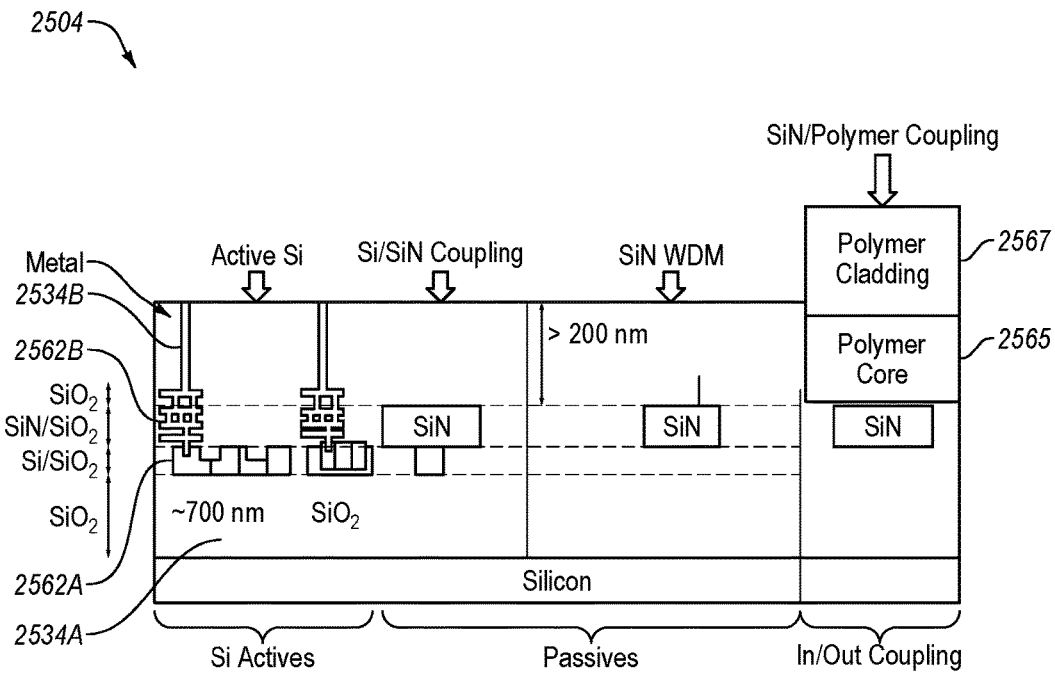
FIG. 25A illustrates an example Si PIC.

FIG. 25A illustrates an example Si PIC 2504 that may be implemented in one or more of the surface coupled systems described herein, arranged in accordance with at least one embodiment described herein. In general, the Si PIC 2504 may include a Si waveguide layer 2562A, at least one SiN waveguide layer 2562B, and SiO2 cladding 2534A-B above, below, and/or around Si and SiN waveguides in the Si and/or SiN waveguide layers 2562A-B. A window may be formed in one or more dielectric layers above the SiN waveguide layer 2562B to receive an end of an interposer, such as a polymer or high index glass interposer. In the example illustrated in FIG. 25A, such an interposer includes a polymer waveguide that includes a polymer core 2565 and a polymer cladding 2567. In at least one embodiment, the Si waveguide layer 2562A may include Ge pin diodes, Si modulators, Si mux, and/or other components or devices. Additional details regarding implementations of the Si PIC of FIG. 25A and/or other Si PICs is described in the '815 application. Although not illustrated in FIG. 25A, the Si PIC 2504 and/or other Si PICs may include a LASG (such as the second surface gratings described herein) to receive light from another LASG (such as the first surface gratings described herein) of a surface coupled edge emitting laser.

Figure 25B:
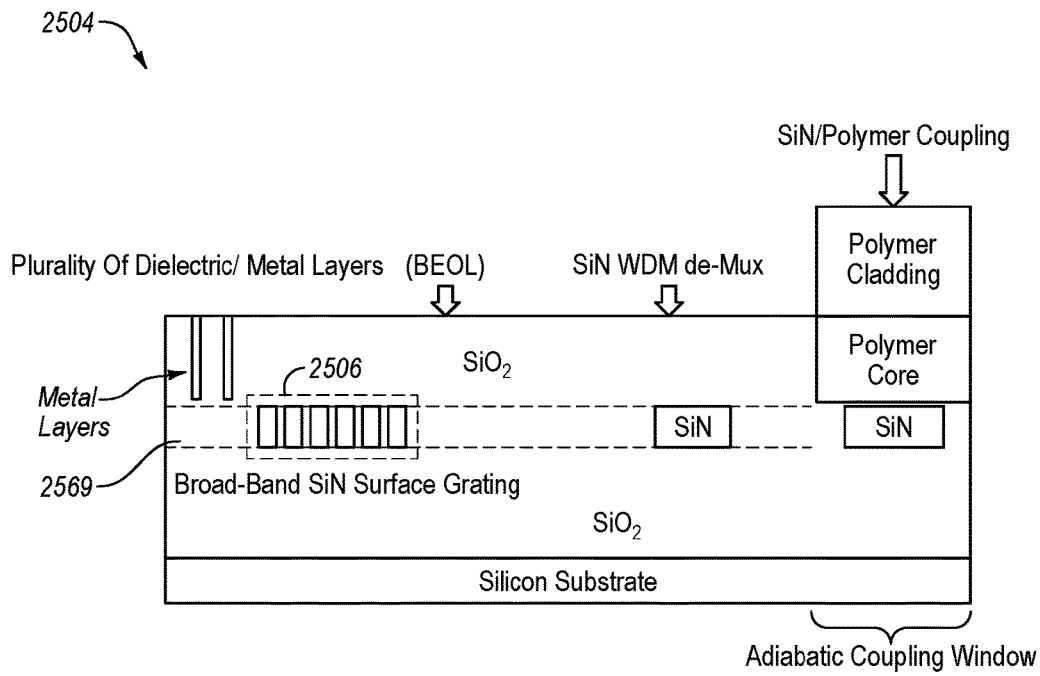
FIG. 25B illustrates another example Si PIC.

FIG. 25B illustrates another example Si PIC 2503 that may be implemented in one or more of the surface coupled systems described herein, arranged in accordance with at least one embodiment described herein. The Si PIC 2503 may be similar in many respects to the Si PIC 2504 of FIG. 25A. One difference between the two is that the Si PIC 2503 in FIG. 25B does not include a Si waveguide layer. In addition, in FIG. 25B, a LASG 2506 (such as the second surface gratings described herein) may be formed in a SiN waveguide layer 2569 of the Si PIC 2503 and may be referred to as a SiN LASG 2506. In an example implementation, the SiN LASG 2506 may be optically coupled to a laser implemented as a DML so that a Si modulator, often used in a Si PIC to modulate light, is not needed and may be omitted from the Si PIC 2503. The surface coupling provided by the SiN LASG 2506 is intended to reduce packaging and assembly cost of a DML based transmitter.

The SiN LASG 2506 of the Si PIC 2503 may have a wider bandwidth than a Si LASG because an effective index of a SiN grating may be smaller than an effective index of a Si grating. The SiN LASG 2506 may also have a larger coupling angle than a Si LASG. Directionality of diffracted light may be improved by adding a mirror (not illustrated) below the SiN LASG 2506.

Figure 26:
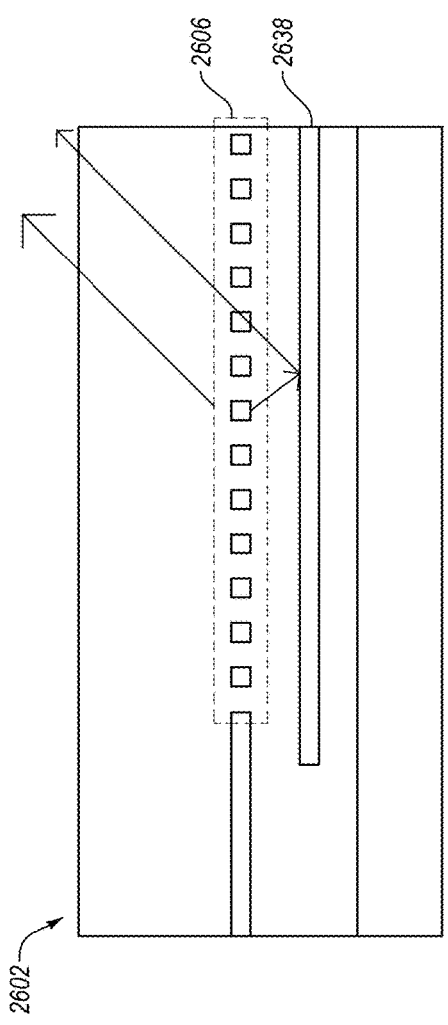
FIG. 26 illustrates a side cross-sectional view of a SiN LASG in a PIC with a mirror.

For instance, FIG. 26 illustrates a side cross-sectional view of a SiN LASG 2606 in a PIC 2602 with a mirror 2638, arranged in accordance with at least one embodiment described herein. The mirror 2638 may be positioned beneath the SiN LASG 2606 a suitable distance to provide constructive interference between light diffracted upward by the SiN LASG 2606 and light reflected upward by the mirror 2638. The mirror 2638 may include a metal reflector layer. In an example embodiment, the mirror 2638 may be positioned about 420 nm below the SiN LASG 2606. Forming the mirror 2638 beneath the SiN LASG 2606 may be compatible with a back end of line (BEOL) process of a manufacturer or fab of the Si PIC 2602 that includes the SiN LASG 2606.

Figure 27:
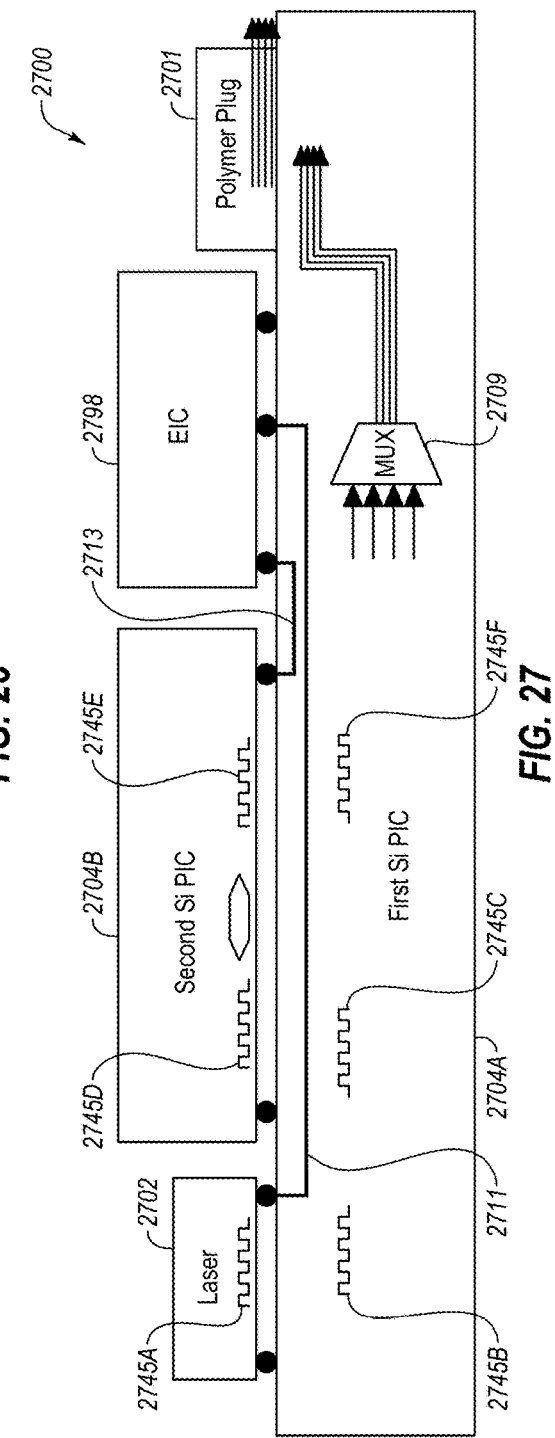
FIG. 27 illustrates another example surface coupled system.

FIG. 27 illustrates another example surface coupled system 2700, arranged in accordance with at least one embodiment described herein. The surface coupled system 2700 may include a surface coupled edge emitting laser (hereinafter "laser") 2702, a first Si PIC 2704A, a second Si PIC 2704B, an electrical integrated circuit (EIC) 2798, and an interposer 2701.

The laser 2702 may be electrically coupled through one or more traces 2711 in the first Si PIC 2704A to the EIC 2798. The EIC 2798 may include a driver, bias circuitry, and/or other elements to drive the laser 2702 to emit an optical beam. The optical beam may be coupled into the first Si PIC 2704A by a first LASG 2745A formed in the laser 2702 and a second LASG 2745B formed in the first Si PIC 2704A.

The first Si PIC 2704A may include one or more SiN waveguide layers formed on a Si substrate. In at least one embodiment, a mux 2709 and other components may be formed in at least one of the SiN waveguide layers. The second LASG 2745B that receives the optical beam from the laser 2702 may be optically coupled by a first SiN waveguide of the first Si PIC 2704A to a third LASG 2745C of the first Si PIC 2704. The optical beam may be carried by the first SiN waveguide from the second LASG 2745B of the first Si PIC 2704A to the third LASG 2745C of the first Si PIC 2704A.

The second Si PIC 2704B may include one or more Si waveguide layers formed on a Si substrate, a fourth LASG 2745D, and a fifth LASG 2745E. The second Si PIC 2704B may include one or more MZ interferometers (MZI), pin diodes, waveguide splitters, Si waveguides, or other components or devices formed therein. The optical beam may be coupled from the third LASG 2745C of the first Si PIC 2704A to the fourth LASG 2745D of the second Si PIC 2704B. The fourth LASG 2745D of the second Si PIC 2704B may be optically coupled to the fifth LASG 2745E of the second Si PIC 2704B by an MZI or one or more other components or devices of the second Si PIC 2704B. The MZI may be electrically coupled, through one or more traces 2713 in the first Si PIC 2704A, to the EIC 2798, which may include a driver, bias circuitry, or other elements to drive the MZI to modulate the optical beam received from the laser 2702 through the first Si PIC 2704A. The modulated optical beam may be output back into the first Si PIC 2704A through the fifth LASG 2745E of the second Si PIC 2704B and a sixth LASG 2745F of the first Si PIC 2704A.

The mux 2709 may have multiple inputs coupled to multiple SiN waveguides to receive multiple such modulated optical beams, which modulated optical beams may be combined into a common output SiN waveguide. The common output SiN waveguide may be adiabatically coupled to an interposer waveguide of the interposer, as described in the '815 application.

In this and other examples, the first Si PIC 2704A may include only SiN layers, components, and devices (as opposed to Si layers, components, and devices) to optimize a SiN fab process of the first Si PIC 2704A, whereas the second Si PIC 2704B may include only Si layers, components, and devices (as opposed to SiN layers, components, and devices) to optimize a Si fab process of the second Si PIC 2704B. For example, the second LASG 2745B, third LASG 2745C, and the sixth LASG 2745F in the first Si PIC 2704A may include SiN LASGs and may be designed to have an optimal thickness from a Si substrate of the first Si PIC 2704A to increase directionality of coupling.

In other embodiments, surface coupled systems may include a laser and a single Si PIC. The laser may be implemented as a DML and the Si PIC may include one or more SiN layers, components, and devices without including any Si layers, components, and devices. Such Si PICs may be referred to as SiN PICs or SiN platforms. The laser may include one or more of the first surface gratings described herein and the SiN platform may include one or more of the second surface gratings described herein. The SiN platform can omit Si waveguides or a Si-based MZI or other Si-based modulator since the laser is directly modulated, in which case the relatively high loss (e.g., 7-8 dB) of a Si modulator may be avoided.

The SiN Platform in this example may serve as a low cost, lens free packaging platform allowing lens free, non-critical pick and place. Light may be coupled out of the SiN platform using an adiabatically coupled polymer interposer or high index glass interposer. The SiN PIC may essentially include the BEOL of a Si photonic process and may include metal layers as well as a SiN LASG as the second surface grating. The SiN platform may include a mux, demux, waveguide splitters, and/or other passive components.

Vertically illuminated pin diodes (InGaAs, Ge/Si, etc.) may be flip chip mounted on the SiN platform and light from SiN waveguides may be coupled to the vertically illuminated pin diodes through a SiN LASG such as described herein. Since high-speed diodes may be about 20 µm tall, and an optical isolator may not be needed between the SiN LASG and the pin, a grating with a 10 µm spot size may be used, although a 20-40 µm spot size such as may be provided by some LASGs described herein may allow for large working distance. In this example, incoming light from a fiber may be adiabatically coupled into the SiN platform 2704A through a polymer interposer or high index glass interposer, as described in the '815 application.

In some embodiments, there may be two requirements for formation of a LASG in a photonics platform. Photonics platforms may include SiN platforms (e.g., one or more SiN waveguide layers on Si substrate), Si platforms (e.g., one or more Si waveguide layers on Si substrate), and Si/SiN platforms (e.g., one or more Si waveguide layers and one or more SiN waveguide layers, all on Si substrate). The term "Si PIC" has been used generically herein to refer to all platforms, unless context dictates otherwise.

The two requirements may include the following:
1) Weak, long grating to allow an expansion of the coupled beam to 8-40 µm or even 20-40 µm
   a. →Grating pitch is adjusted to maximize
2) A waveguide with strong enough confinement to allow for diffraction of the beam in the lateral direction to achieve a beam size roughly equal to 8-40 µm or even 20-40 µm A LASG formed in a Si platform may meet the first condition. However, the mode size in glass waveguides may be largely due to small value of index difference between core and cladding, e.g., an index difference may be roughly 0.006-0.03. A LASG formed in a SiN platform may provide high enough confinement and an index difference may be roughly 0.5 so that a waveguide mode with a width roughly equal to 1 µm may be achievable, requiring a fan out length of roughly 250 µm. The choice between a Si platform and a SiN platform may depend on directionality (ratio of power diffracted up vs. down), which may also be a function of the substrate and a $SiO_2$ box layer.

Figure 28:
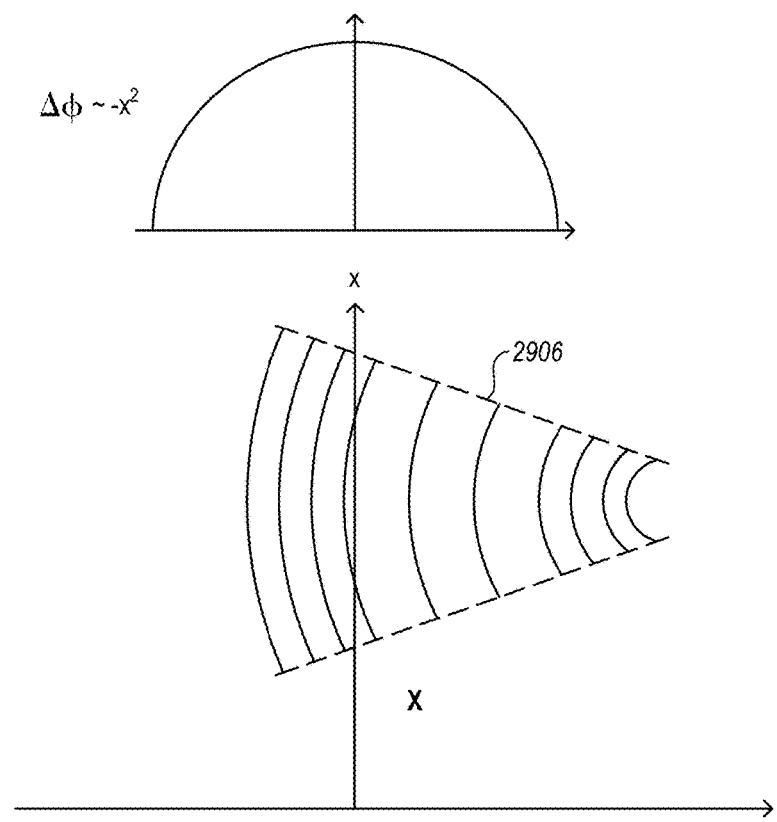
FIG. 28 illustrates an example focusing surface grating that may be implemented in one or both of the first and second surface gratings or other LASGs described herein.

FIG. 28 illustrates an example focusing surface grating 2906 that may be implemented in one or both of the first and second surface gratings or other LASGs described herein, arranged in accordance with at least one embodiment described herein.

Figure 29:
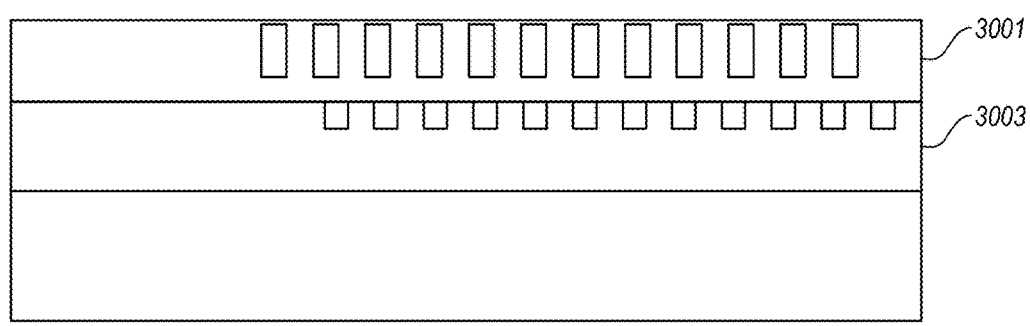
FIG. 29 depicts an example concept to increase directionality of a surface grating that may be implemented in one or both of the first and second surface gratings described herein.

FIG. 29 depicts an example concept to increase directionality of a surface grating that may be implemented in one or both of the first and second surface gratings described herein, arranged in accordance with at least one embodiment described herein. In the example of FIG. 29, one surface grating 3001 may be formed over another surface grating 3003, where one is shifted relative to the other. The two stacked surface gratings may be implemented together as one of the first surface gratings to diffract light out of a laser or as one of the second surface gratings to diffract light into a Si PIC as described herein.

Figure 30A:
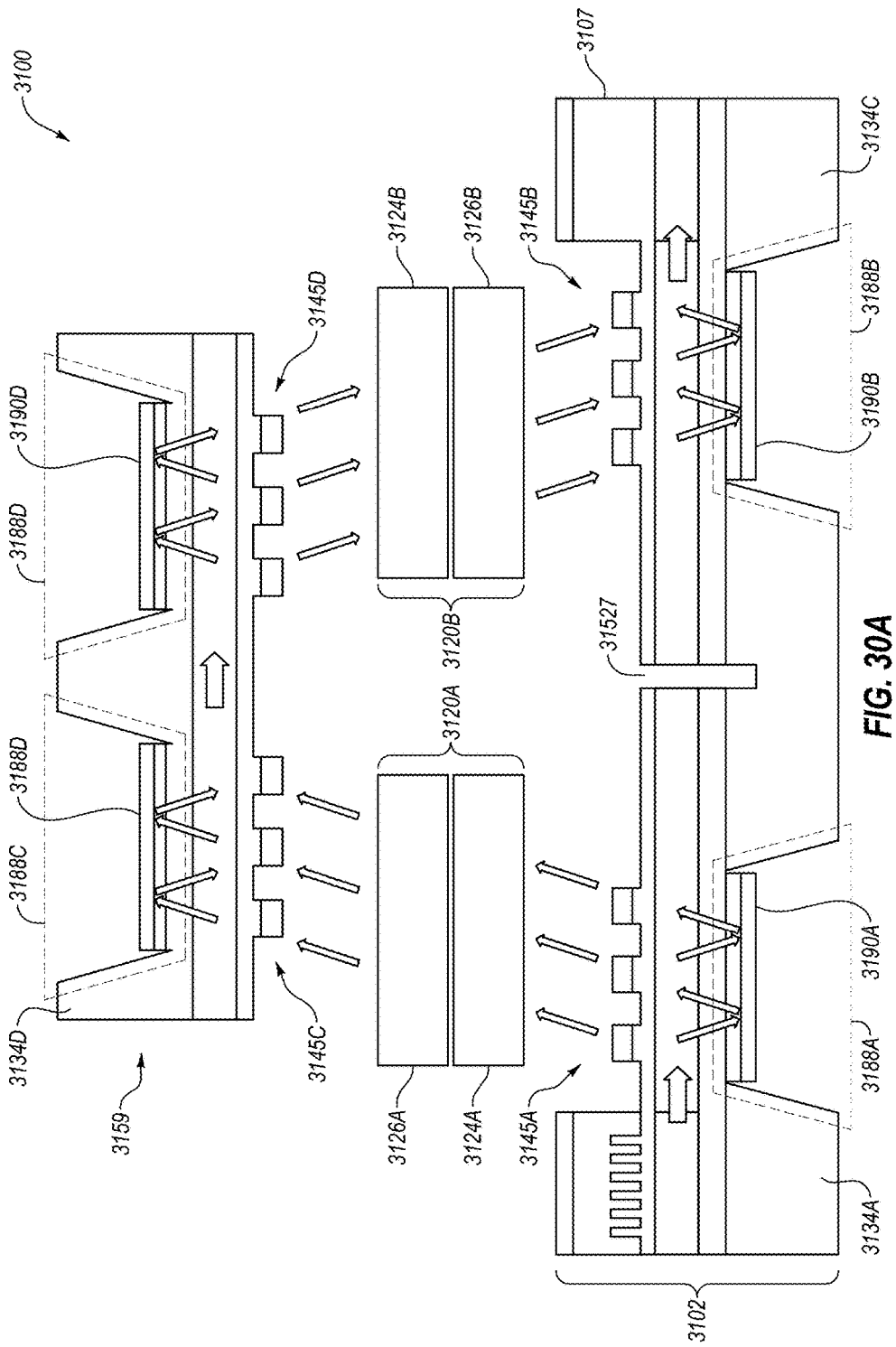
FIG. 30A illustrates another example surface coupled system.

FIG. 30A illustrates another example surface coupled system 3100, arranged in accordance with at least one embodiment described herein. The system 3100 may include a surface coupled edge emitting laser (hereinafter "laser") 3102. The laser 3102 may include or correspond to any of the other lasers described herein. The laser 3102 may be implemented as an InP laser. The laser 3102 may be in a same chip with an InP MZ modulator 3107, where the laser 3102 and InP MZ modulator 3107 may be separated by an angled isolation trench 3157. The laser 3102 may include a first LASG 3145A to couple light out of the laser 3102. The InP MZ modulator 3107 may include a second LASG 3145B to couple light into the InP MZ modulator 3107.

The surface coupled system 3100 may also include a bridge 3159. The bridge 3159 may include a third LASG 3145C to couple light into the bridge 3159 from the first LASG 3145A of the laser 3102 and a fourth LASG 3145D to couple light out of the bridge 3159 into the second LASG 3145B of the InP MZ modulator 3107.

The surface coupled system 3100 may additionally include first and second optical isolators 3120A-B. The first optical isolator 3120A may include a first polarizer 3124A and a first Faraday rotator 3126A. The first polarizer 3124A and the first Faraday rotator 3126A may be located between the first LASG 3145A of the laser 3102 and the third LASG 3145C of the bridge 3159. The second optical isolator 3120B may include a second polarizer 3124B and a second Faraday rotator 3126B. The second polarizer 3124B and the second Faraday rotator 3126B may be located between the fourth LASG 3145D of the bridge 3159 and the second LASG 3145B of the InP MZ modulator 3107.

Within an InP substrate 3134A-C of the laser 3702 and InP MZ modulator 3107, multiple windows 3188A-B may be etched beneath a corresponding LASG 3145A-B. An HR coating 3190A-B may be applied beneath the corresponding LASG 3145A-B to form bottom mirrors. Similarly, within an InP substrate 3134D of the bridge 3159, multiple windows 3188C-D may be etched above the corresponding LASG 3145C-D. An HR coating 3190C-D may be applied above the corresponding LASG 3145C-D to form top mirrors. In some embodiments, the bridge 3159 may be formed in a same wafer as the laser 3102 and the InP MZ modulator 3107, in which case the bridge 3159 may be flipped upside down after fabrication.

In operation, the laser 3102 may emit an optical beam, which may include a continuous wave (CW) beam in some embodiments. The optical beam may be coupled from the laser 3102 through the first optical isolator 3120A to the bridge 3159 by the first LASG 3145A of the laser 3102 and the third LASG 3145C of the bridge 3159. The third LASG 3145C of the bridge 3159 may be optically coupled to the fourth LASG 3145D of the bridge 3159 and may redirect the optical beam to the fourth LASG 3145D of the bridge 3159.

The fourth LASG 3145D of the bridge 3159 may couple the optical beam out of the bridge 3159 through the second optical isolator 3120B and the second LASG 3145B of the InP MZ modulator 3107 into the InP MZ modulator 3107, where the optical beam may be modulated to form an optical signal with information encoded thereon.

In one embodiment, it may be useful to isolate the laser 3102 from time modulated reflections within the InP MZ modulator 3107. In this example, two stage isolation may be achieved by hybrid integration. The bridge 3159 may be cleaved out of a same wafer as the laser 3102 and the InP MZ modulator 3107 such that the bridge 3159 may have a match in terms of layer thicknesses, compositions, and LASG grating depth with the laser 3102 and the InP MZ modulator 3107. Having matching terms of layer thicknesses, compositions, and LASG grating depth may result in optimal LASG-to-LASG insertion loss performance. The laser 3102, InP MZ modulator 3107, and bridge 3159 may be delivered together on the same wafer for simplified inventory management.

FIG. 30A illustrates an example implementation of the surface coupled system 3100 of FIG. 30A, arranged in accordance with at least one embodiment described herein.

Figure 30B:
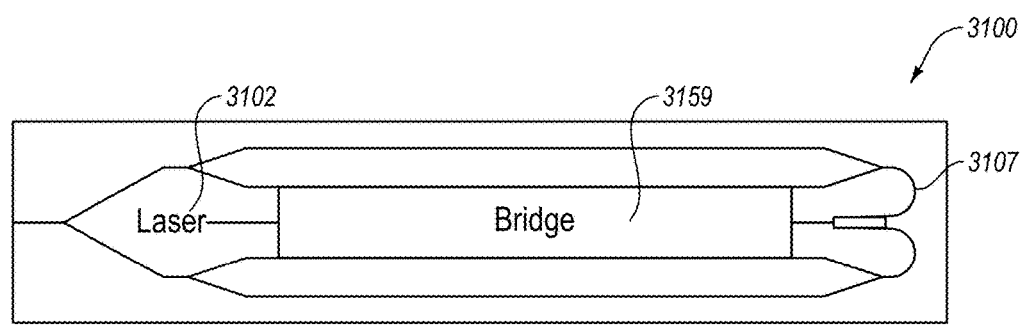
FIG. 30B illustrates an example implementation of the surface coupled system of FIG. 30A.
Figure 31:
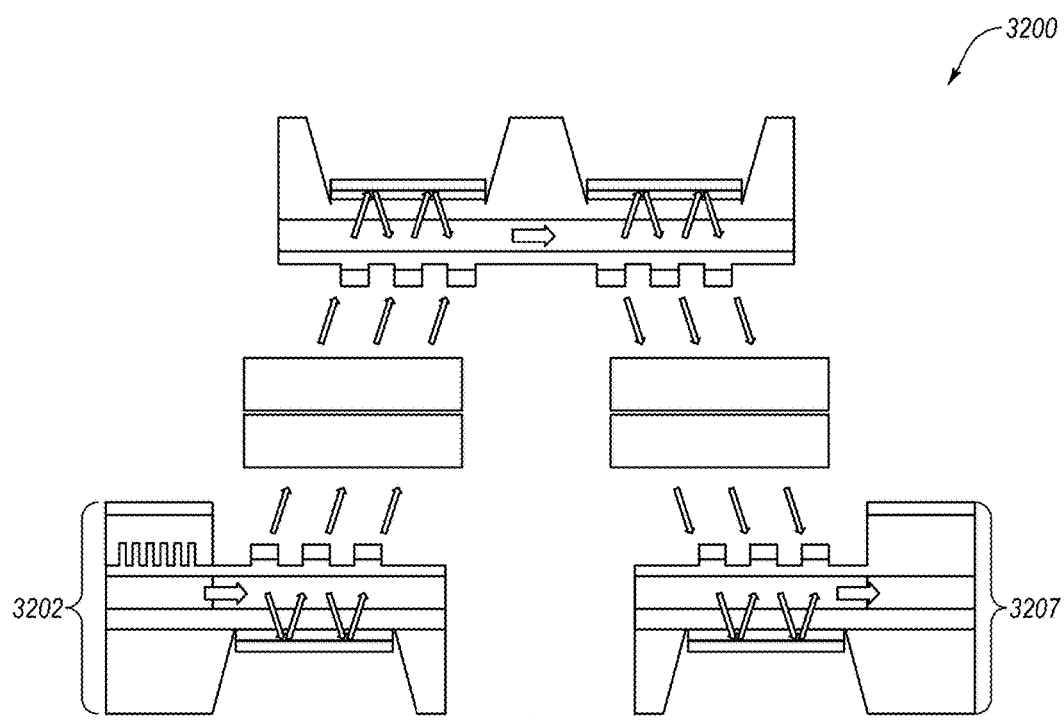
FIG. 31 illustrates another example surface coupled system.

FIG. 31 illustrates another example surface coupled system 3200, arranged in accordance with at least one embodiment described herein. The system 3200 is similar to the system 3100 of FIGS. 30A and 30B except that a laser 3202 and an InP MZ modulator 3207 may be completely separated to take advantage of placement tolerance and reduce total InP chip cost.

Figure 32:
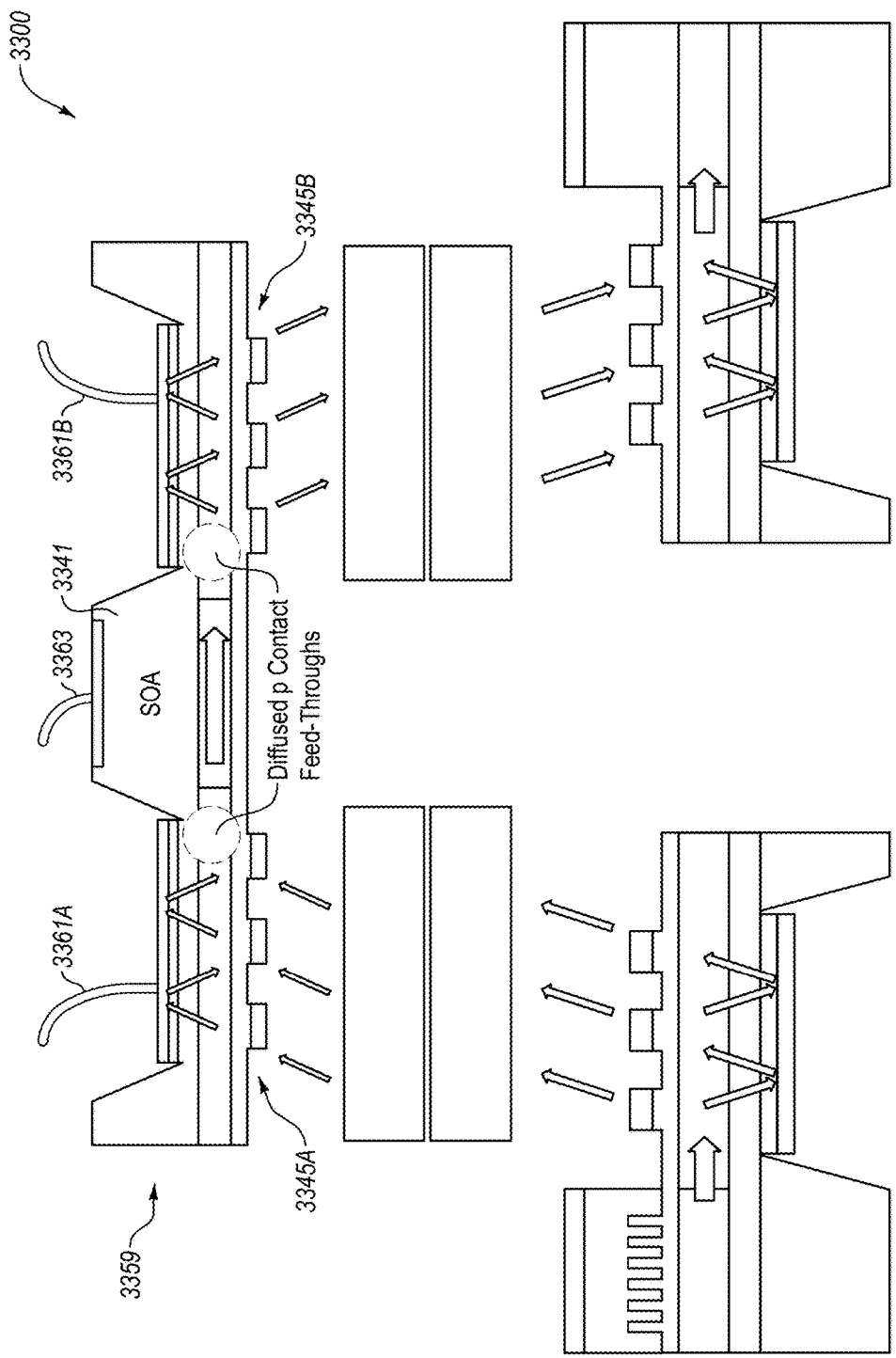
FIG. 32 illustrates another example surface coupled system.

FIG. 32 illustrates another example surface coupled system 3300, arranged in accordance with at least one embodiment described herein. The system 3300 may include a bridge 3359 that includes a semiconductor optical amplifier (SOA) 3341 between a first LASG 3345A and a second LASG 3345B. The first and second LASGs 3345A-B may include P contacts 3361A-B and N contacts 3363 on a back side of the 3359. The bridge 3359 may also include multiple p-dopant diffused feedthroughs 3365A-B. In any of the example embodiments illustrated in FIGS. 30A, 30B, 31, and 32, the waveguide section within the bridge that is situated between the third and fourth LASG 3145C and 3145D can effect a change in direction within the bridge, namely that the waveguide does not have to remain rectilinear between the third LASG 3145C and fourth LASG 3145D. A change in direction of this waveguide section could be included to facilitate the assembly of the subcomponents (3102 and 3159) themselves, and/or to improve the optical isolation performance of the completed device.

The concept of LASGs may be extended to other InP devices besides lasers. For example, electro-absorption modulators (EAMs), InP MZ modulators and/or other InP devices. In these and other embodiments, LASGs included in the InP devices and/or Si PICs may be designed to have a 8-40 μm spot size or even a 20-40 μm spot size to allow a high alignment tolerance and lens free assembly, to thereby reduce costs.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
a surface coupled edge emitting laser comprising:
a core waveguide;
a fan out region optically coupled to the core waveguide in a same layer of the surface coupled edge emitting laser as the core waveguide;
a first surface grating formed in the fan out region, wherein the first surface grating diffracts light emitted by the surface coupled edge emitting laser upward and downward;
one or more lower layers beneath the core waveguide, wherein the one or more lower layers are substantially transparent to light emitted by the surface coupled edge emitting laser;
a top mirror positioned above the first surface grating, wherein the top mirror reflects upward-diffracted light downward;
a dielectric positioned above the core waveguide and the first surface grating and below the top mirror, wherein the dielectric contains a thickness to allow the reflected upward-diffracted light to add in phase with downward-diffracted light;
an active section that includes a distributed feedback (DFB) laser, wherein the DFB laser is positioned above the one or more lower layers and is optically coupled end to end with the core waveguide;
a passive section that includes a core region and the fan out region, wherein the passive section is optically coupled end to end with the active section and includes the top mirror; and
a photonic integrated circuit (PIC) comprising an optical waveguide and a second surface grating formed in an upper layer of the PIC, wherein the second surface grating is in optical alignment with the first surface grating.

2. The system of claim 1, further comprising an optical isolator positioned between the first surface grating and the second surface grating, wherein:
the first surface grating is configured to redirect light received from the core waveguide downward toward the second surface grating;
the second surface grating is positioned to receive the light from the first surface grating after the light passes through the optical isolator; and
the second surface grating is configured to redirect light received from the first surface grating into the optical waveguide.

3. The system of claim 1, wherein each of the first surface grating and the second surface grating comprises a long surface grating to produce a large diffracted spot.

4. The system of claim 1, further comprising an optical isolator positioned between the first surface grating and the second surface grating, wherein:
the optical isolator has a physical thickness in a range of 300-800 micrometers (μm); and
the optical isolator comprises a garnet with an input polarizer coupled to an upper surface of the garnet and an output polarizer coupled to a lower surface of the garnet.

5. The system of claim 4, wherein a surface area of each of an upper surface of the optical isolator and a lower surface of the optical isolator is less than 200 μm$^2$.

6. A system comprising:
a surface coupled edge emitting laser comprising:
a core waveguide;
a fan out region optically coupled to the core waveguide in a same layer of the surface coupled edge emitting laser as the core waveguide;
a first surface grating formed in the fan out region, wherein the first surface grating diffracts light emitted by the surface coupled edge emitting laser;
one or more lower layers beneath the core waveguide, wherein the one or more lower layers are substantially transparent to light emitted by the surface coupled edge emitting laser;
an active section that includes a distributed feedback (DFB) laser, wherein the DFB laser is positioned above the one or more lower layers and is optically coupled end to end with the core waveguide;
a passive section that includes a core region and the fan out region, wherein the passive section is optically coupled end to end with the active section and includes a top mirror; and
a photonic integrated circuit (PIC) comprising an optical waveguide and a second surface grating formed in an upper layer of the PIC, wherein the second surface grating is in optical alignment with the first surface grating;
wherein the surface coupled edge emitting laser further comprises a ridge structure formed in the active section and the passive section, wherein the ridge structure comprises a shallow ridge that extends downward to a depth in the active section above a depth of a multiple quantum well layer of the active section and a deep ridge that extends downward to a depth in the passive section below the depth of the multiple quantum well layer.

7. The system of claim 1, wherein the surface coupled edge emitting laser comprises a directly modulated laser (DML).

8. The system of claim 7, further comprising an electrical integrated circuit (EIC) mechanically and electrically coupled to the PIC, wherein electrical signals are carried from the EIC to the surface-coupled edge emitting laser through high-speed lines in the PIC.

9. The system of claim 8, wherein the PIC further comprises an optical multiplexer.

10. The system of claim 1, wherein the first surface grating comprises a focusing grating.

11. The system of claim 7, further comprising a high speed substrate, wherein the surface coupled edge emitting laser is bonded to the high speed substrate p-side down.

12. The system of claim 11, further comprising at least one of a high-speed driver or a clock and data recovery (CDR) circuit mounted to the high speed substrate and communicatively coupled to the surface coupled edge emitting laser.

13. The system of claim 7, wherein the optical waveguide of the PIC includes a silicon nitride (SiN) waveguide, the system further comprising an interposer that includes an interposer waveguide adiabatically coupled at one end of the interposer waveguide to the SiN waveguide and butt-coupled at an opposite end of the interposer waveguide to an optical fiber.

14. The system of claim 7, wherein the optical waveguide of the PIC includes a silicon (Si) waveguide and the PIC further includes a silicon nitride (SiN) waveguide adiabatically coupled to the Si waveguide, the system further comprising an interposer that includes an interposer waveguide adiabatically coupled at one end of the interposer waveguide to the SiN waveguide and butt-coupled at an opposite end of the interposer waveguide to an optical fiber.

15. The system of claim 1, wherein the second surface grating comprises a silicon nitride (SiN) diffraction grating.

16. The system of claim 1, wherein the surface coupled edge emitting laser further comprises:
a substrate above which the core waveguide, the fan out region, and the first surface grating are formed, the substrate defining a window formed therein beneath the first surface grating; and
a high reflectivity coating formed in the window beneath the first surface grating.

17. The system of claim 1, wherein a working distance between the first surface grating and the second surface grating is at least 100 micrometers.

18. The system of claim 1, wherein the first surface grating is configured to generate a spot size in a range from 8 micrometers (μm) to 40 μm.

19. The system of claim 1, wherein the surface coupled edge emitting laser comprises indium phosphide.

20. The system of claim 1, wherein the surface coupled edge emitting laser comprises a hybrid laser.

21. The system of claim 17, further comprising a first optical isolator positioned in a first optical path between the first surface grating and a third surface grating and without any lenses in the first optical path and a second optical isolator positioned in a second optical path between the second surface grating and a fourth surface grating and without any lenses in the second optical path.

22. A system comprising:
a surface coupled edge emitting laser comprising a first waveguide and a first diffraction grating optically coupled to the first waveguide; and
a photonic integrated circuit (PIC) comprising a second waveguide and a second diffraction grating optically coupled to the second waveguide,
wherein:
the first waveguide of the surface coupled edge emitting laser comprises a core with a core index of refraction, a top cladding with a top cladding index of refraction, and a substrate as a bottom cladding with a bottom cladding index of refraction;
the first diffraction grating comprises grating teeth formed on the core of the first waveguide, the grating teeth extending upward from a top of the core of the first waveguide, the grating teeth each having a total height, a height above the top of the core of the first waveguide, a period, and a duty cycle; and
the core index of refraction is greater than a first threshold value so that an effective index of the first diffraction grating is sufficiently higher than the bottom cladding index to avoid leakage of a diffracted optical mode into the substrate.

23. The system of claim 22, further comprising an optical isolator positioned in an optical path between the first diffraction grating and the second diffraction grating and without any lenses in the optical path between the first diffraction grating and the second diffraction grating.

24. The system of claim 22, wherein the core index of refraction is in a range from 3.4 to 3.44.

25. The system of claim 22, wherein:
a height of the core is 300-380 nanometers (nm);
the total height of the grating teeth is 600-680 nm;
the core index of refraction is in a range from 3.4 to 3.44;
the bottom cladding comprises indium phosphide; and the top cladding index of refraction is in a range from 1 to 2.

26. The system of claim 25, wherein the period of the first diffraction grating is in a range from 500-600 nm and the duty cycle of the first diffraction grating is in a range from 0.3-0.5.

27. The system of claim 22, wherein the effective index of the first diffraction grating depends on at least the core index of refraction and the top cladding index of refraction and is at least 6% higher than the bottom cladding index of refraction.

28. The system of claim 22, wherein the top cladding includes top cladding teeth that alternate with the grating teeth in the first diffraction grating, the top cladding teeth having the top cladding index of refraction and the grating teeth have a grating tooth index of refraction that is greater than or equal to the core index of refraction.

29. The system of claim 28, wherein the grating teeth have a same material composition as the core such that the core index of refraction and the grating tooth index of refraction are the same.

30. A system comprising:
   a surface coupled edge emitting semiconductor optical amplifier (SOA) comprising a core waveguide, a first fan out region optically coupled to a first end of the core waveguide in a same layer of the surface coupled edge emitting SOA as the core waveguide, a first surface grating formed in the first fan out region, a second fan out region optically coupled to a second end of the core waveguide in the same layer of the surface coupled edge emitting SOA as the core waveguide, and a second surface grating formed in the second fan out region; and
   a photonic integrated circuit (PIC) comprising a first optical waveguide, a second optical waveguide, a third surface grating formed in an upper layer of the PIC and optically coupled to the first optical waveguide, and a fourth surface grating formed in the upper layer of the PIC and optically coupled to the second optical waveguide, wherein the third surface grating is in optical alignment with the first surface grating of the surface coupled edge emitting SOA and the fourth surface grating is in optical alignment with the second surface grating of the surface coupled edge emitting SOA.

31. The system of claim 30, wherein a working distance between the first surface grating and the third surface grating and between the second surface grating and the fourth surface grating is at least 50 micrometers.

32. The system of claim 30, wherein each of the first surface grating and the third surface grating is configured to generate a spot size in a range from 8 micrometers (μm) to 40 μm.

33. The system of claim 6, wherein the deep ridge increases mode confinement, the increased mode confinement increasing the diffraction of light by the first surface grating.

34. The system of claim 6, wherein the shallow ridge extends through the entirety of the active section and the deep ridge extends through the entirety of the passive section.

* * * * *